(12) United States Patent
Siddik et al.

(10) Patent No.: US 10,454,024 B2
(45) Date of Patent: Oct. 22, 2019

(54) MEMORY CELLS, METHODS OF FABRICATION, AND MEMORY DEVICES

(71) Applicant: Micron Technology, Inc., Boise, ID (US)

(72) Inventors: Manzar Siddik, Singapore (SG); Witold Kula, Gilroy, CA (US)

(73) Assignee: Micron Technology, Inc., Boise, ID (US)

( * ) Notice: Subject to any disclaimer, the term of this patent is extended or adjusted under 35 U.S.C. 154(b) by 120 days.

(21) Appl. No.: 14/193,979

(22) Filed: Feb. 28, 2014

(65) Prior Publication Data

US 2015/0249202 A1 Sep. 3, 2015

(51) Int. Cl.
*H01L 43/12* (2006.01)
*H01L 43/08* (2006.01)

(52) U.S. Cl.
CPC .............. *H01L 43/12* (2013.01); *H01L 43/08* (2013.01)

(58) Field of Classification Search
CPC .......... H01L 43/02; H01L 43/08; H01L 43/10
USPC ........................................................ 257/421
See application file for complete search history.

(56) References Cited

U.S. PATENT DOCUMENTS

| 4,882,936 A | 11/1989 | Garshelis |
| 5,551,586 A | 9/1996 | Uenoyama et al. |
| 5,563,000 A | 10/1996 | Hatwar et al. |
| 5,565,266 A | 10/1996 | Hatwar et al. |
| 5,583,725 A | 12/1996 | Coffey et al. |
| 5,604,030 A | 2/1997 | Yamane et al. |

(Continued)

FOREIGN PATENT DOCUMENTS

| CN | 101162756 A | 4/2008 |
| CN | 101395732 A | 3/2009 |

(Continued)

OTHER PUBLICATIONS

Apalkov et al., Comparison of Scaling of In-Plane and Perpendicular Spin Transfer Switching Technologies by Micromagnetic Simulation, IEEE Transactions on Magnetics, vol. 46, Issue 6, (Jun. 2010), pp. 2240-2243 (abstract only).

(Continued)

*Primary Examiner* — Meiya Li
*Assistant Examiner* — Peter M Albrecht
(74) *Attorney, Agent, or Firm* — TraskBritt

(57) ABSTRACT

A magnetic cell includes a magnetic region formed from a precursor magnetic material. The precursor magnetic material included a diffusible species and at least one other species. An oxide region is disposed between the magnetic region and another magnetic region, and an amorphous region is proximate to the magnetic region. The amorphous region includes an attracter material that has a chemical affinity for the diffusible species that is higher than a chemical affinity of the at least one other species for the diffusible species. Thus, the diffusible species is transferred from the precursor magnetic material to the attracter material, forming a depleted magnetic material. The removal of the diffusible species and the amorphous nature of the region of the attracter material promotes crystallization of the depleted magnetic material, which enables high tunnel magnetoresistance and high magnetic anisotropy strength. Methods of fabrication and semiconductor devices are also disclosed.

32 Claims, 9 Drawing Sheets

(56) References Cited

U.S. PATENT DOCUMENTS

| | | |
|---|---|---|
| 5,768,069 A | 6/1998 | Mauri |
| 6,166,948 A | 12/2000 | Parkin et al. |
| 6,258,470 B1 | 7/2001 | Sakakima et al. |
| 6,275,363 B1 | 8/2001 | Gill |
| 6,347,049 B1 | 2/2002 | Childress et al. |
| 6,363,000 B2 | 3/2002 | Perner et al. |
| 6,387,476 B1 | 5/2002 | Iwasaki et al. |
| 6,483,741 B1 | 11/2002 | Iwasaki et al. |
| 6,560,135 B2 | 5/2003 | Matsuoka et al. |
| 6,569,545 B1 | 5/2003 | Kanbe et al. |
| 6,611,405 B1 | 8/2003 | Inomata et al. |
| 6,653,704 B1 | 11/2003 | Gurney et al. |
| 6,703,249 B2 | 3/2004 | Okazawa et al. |
| 6,771,534 B2 | 8/2004 | Stipe |
| 6,806,096 B1 | 10/2004 | Kim et al. |
| 6,845,038 B1 | 1/2005 | Shukh |
| 6,955,857 B2 | 10/2005 | Kubota et al. |
| 6,964,819 B1 | 11/2005 | Girt et al. |
| 6,970,376 B1 | 11/2005 | Fukuzumi |
| 6,980,468 B1 | 12/2005 | Ounadjela |
| 6,992,359 B2 | 1/2006 | Nguyen et al. |
| 6,998,150 B2 | 2/2006 | Li et al. |
| 7,026,671 B2 | 4/2006 | Mizuguchi et al. |
| 7,095,933 B2 | 8/2006 | Barth |
| 7,130,167 B2 | 10/2006 | Gill |
| 7,189,583 B2 | 3/2007 | Drewes |
| 7,230,265 B2 | 6/2007 | Kaiser et al. |
| 7,239,489 B2 | 7/2007 | Lin et al. |
| 7,274,080 B1 | 9/2007 | Parkin |
| 7,329,280 B2 | 2/2008 | Bolling et al. |
| 7,372,674 B2 | 5/2008 | Gill |
| 7,378,698 B2 | 5/2008 | Ha et al. |
| 7,379,280 B2 | 5/2008 | Fukumoto et al. |
| 7,486,552 B2 | 2/2009 | Apalkov et al. |
| 7,488,609 B1 | 2/2009 | Lin et al. |
| 7,514,160 B2 | 4/2009 | Nagahama et al. |
| 7,563,486 B2 | 7/2009 | Barth |
| 7,564,152 B1 | 7/2009 | Clark et al. |
| 7,602,033 B2 | 10/2009 | Zhao et al. |
| 7,660,153 B2 | 2/2010 | Yamane et al. |
| 7,682,841 B2 | 3/2010 | Dahmani et al. |
| 7,732,881 B2 | 6/2010 | Wang |
| 7,750,421 B2 | 7/2010 | Horng et al. |
| 7,791,844 B2 | 9/2010 | Carey et al. |
| 7,835,173 B2 | 11/2010 | Ma et al. |
| 7,863,060 B2 | 1/2011 | Belen et al. |
| 7,885,105 B2 | 2/2011 | Li et al. |
| 7,919,794 B2 | 4/2011 | Gu et al. |
| 7,929,370 B2 | 4/2011 | Min |
| 7,932,572 B2 | 4/2011 | Tsujiuchi |
| 7,948,044 B2 | 5/2011 | Horng et al. |
| 8,009,465 B2 | 8/2011 | Nakayama et al. |
| 8,043,732 B2 | 10/2011 | Anderson et al. |
| 8,048,492 B2 | 11/2011 | Fukuzawa et al. |
| 8,068,317 B2 | 11/2011 | Gill |
| 8,080,432 B2 | 12/2011 | Horng et al. |
| 8,089,137 B2 | 1/2012 | Lung et al. |
| 8,102,700 B2 | 1/2012 | Liu et al. |
| 8,120,949 B2 | 2/2012 | Ranjan et al. |
| 8,138,561 B2 | 3/2012 | Horng et al. |
| 8,223,539 B2 | 7/2012 | Smythe et al. |
| 8,324,697 B2 | 12/2012 | Worledge |
| 8,334,148 B2 | 12/2012 | Jeong et al. |
| 8,338,004 B2 | 12/2012 | Shin et al. |
| 8,357,962 B2 | 1/2013 | Marukame et al. |
| 8,385,107 B2 | 2/2013 | Prejbeanu |
| 8,411,498 B2 | 4/2013 | Kim et al. |
| 8,422,286 B2 | 4/2013 | Ranjan et al. |
| 8,470,462 B2 | 6/2013 | Horng et al. |
| 8,487,390 B2 | 7/2013 | Dimitrov et al. |
| 8,492,169 B2 | 7/2013 | Cao et al. |
| 8,514,527 B2 * | 8/2013 | Komagaki ............ B82Y 10/00 360/324.11 |
| 8,570,798 B2 | 10/2013 | Meade et al. |
| 8,587,043 B2 | 11/2013 | Natori et al. |
| 8,604,573 B2 | 12/2013 | Yamakawa et al. |
| 8,623,452 B2 | 1/2014 | Zhou |
| 8,692,342 B2 | 4/2014 | Oh et al. |
| 8,704,320 B2 | 4/2014 | Zhu et al. |
| 8,749,003 B2 | 6/2014 | Horng et al. |
| 8,766,341 B2 | 7/2014 | Han et al. |
| 8,779,538 B2 | 7/2014 | Chen et al. |
| 8,803,265 B2 | 8/2014 | Lim et al. |
| 8,812,803 B2 | 8/2014 | Tsuchiya et al. |
| 8,823,118 B2 | 9/2014 | Horng et al. |
| 8,854,876 B2 | 10/2014 | Uchida et al. |
| 8,923,038 B2 | 12/2014 | Kula et al. |
| 9,373,780 B2 | 6/2016 | Jan et al. |
| 9,705,075 B2 | 7/2017 | Lim et al. |
| 2001/0024853 A1 | 9/2001 | Wallace et al. |
| 2002/0089874 A1 | 7/2002 | Nickel et al. |
| 2002/0097534 A1 | 7/2002 | Sun et al. |
| 2002/0105827 A1 | 8/2002 | Redon et al. |
| 2002/0114112 A1 | 8/2002 | Nakashio et al. |
| 2003/0011939 A1 | 1/2003 | Gill |
| 2003/0030434 A1 | 2/2003 | Hasegawa et al. |
| 2003/0035255 A1 | 2/2003 | Hasegawa et al. |
| 2003/0063415 A1 | 4/2003 | Hasegawa et al. |
| 2003/0064569 A1 | 4/2003 | Takayama et al. |
| 2003/0103371 A1 | 6/2003 | Kim et al. |
| 2003/0142562 A1 | 7/2003 | Kreupl |
| 2003/0199104 A1 | 10/2003 | Leuschner et al. |
| 2003/0228710 A1 | 12/2003 | Drewes |
| 2004/0008455 A1 | 1/2004 | Hasegawa et al. |
| 2004/0075959 A1 | 4/2004 | Gill |
| 2004/0091744 A1 | 5/2004 | Carey et al. |
| 2004/0144995 A1 * | 7/2004 | Nagahama ............ B82Y 10/00 257/200 |
| 2004/0174740 A1 | 9/2004 | Lee et al. |
| 2004/0224243 A1 | 11/2004 | Yoshizawa et al. |
| 2004/0233760 A1 | 11/2004 | Guo et al. |
| 2004/0246776 A1 | 12/2004 | Covington |
| 2005/0019608 A1 | 1/2005 | Kim et al. |
| 2005/0024786 A1 | 2/2005 | Gill et al. |
| 2005/0036361 A1 | 2/2005 | Fukuzumi |
| 2005/0068683 A1 | 3/2005 | Gill |
| 2005/0087511 A1 | 4/2005 | Sharma et al. |
| 2005/0106810 A1 | 5/2005 | Pakala et al. |
| 2005/0164414 A1 | 7/2005 | Deak |
| 2005/0173698 A1 | 8/2005 | Drewes |
| 2005/0189574 A1 | 9/2005 | Nguyen et al. |
| 2005/0211973 A1 | 9/2005 | Mori et al. |
| 2005/0230743 A1 | 10/2005 | Nakagawa et al. |
| 2005/0231853 A1 | 10/2005 | Li et al. |
| 2005/0233174 A1 | 10/2005 | Munteanu et al. |
| 2005/0276099 A1 | 12/2005 | Horng et al. |
| 2006/0002039 A1 | 1/2006 | Hasegawa et al. |
| 2006/0038213 A1 | 2/2006 | Mori et al. |
| 2006/0042930 A1 | 3/2006 | Mauri |
| 2006/0114714 A1 | 6/2006 | Kanegae |
| 2006/0118842 A1 | 6/2006 | Iwata |
| 2006/0261425 A1 | 11/2006 | Suemitsu et al. |
| 2007/0008661 A1 | 1/2007 | Min et al. |
| 2007/0026263 A1 | 2/2007 | Kubota et al. |
| 2007/0035890 A1 | 2/2007 | Sbiaa |
| 2007/0053112 A1 | 3/2007 | Papworth Parkin |
| 2007/0086121 A1 | 4/2007 | Nagase et al. |
| 2007/0132003 A1 | 6/2007 | Takashima et al. |
| 2007/0201265 A1 | 8/2007 | Ranjan et al. |
| 2007/0217071 A1 | 9/2007 | Inamura et al. |
| 2007/0297220 A1 | 12/2007 | Yoshikawa et al. |
| 2008/0164502 A1 | 7/2008 | Fukumoto et al. |
| 2008/0164548 A1 | 7/2008 | Ranjan et al. |
| 2008/0170329 A1 | 7/2008 | Thangaraj et al. |
| 2008/0179699 A1 | 7/2008 | Horng et al. |
| 2008/0182131 A1 | 7/2008 | Iwasaki |
| 2008/0205130 A1 | 8/2008 | Sun et al. |
| 2008/0225581 A1 | 9/2008 | Yamane et al. |
| 2008/0242088 A1 | 10/2008 | Suzuki |
| 2008/0253039 A1 * | 10/2008 | Nagamine ............ B82Y 10/00 360/324.2 |
| 2008/0278867 A1 | 11/2008 | Fukumoto et al. |
| 2009/0039450 A1 | 2/2009 | Lee et al. |
| 2009/0079018 A1 | 3/2009 | Nagase et al. |

(56) References Cited

U.S. PATENT DOCUMENTS

| | | |
|---|---|---|
| 2009/0096043 A1 | 4/2009 | Min et al. |
| 2009/0108383 A1 | 4/2009 | Horng et al. |
| 2009/0136313 A1 | 5/2009 | Soshi et al. |
| 2009/0168238 A1 | 7/2009 | Kim et al. |
| 2009/0180215 A1 | 7/2009 | Ishikawa et al. |
| 2009/0190262 A1 | 7/2009 | Murakami et al. |
| 2009/0195924 A1 | 8/2009 | Nemoto et al. |
| 2009/0218645 A1* | 9/2009 | Ranjan .............. G11C 11/16 257/421 |
| 2009/0229111 A1 | 9/2009 | Zhao et al. |
| 2009/0231909 A1 | 9/2009 | Dieny et al. |
| 2009/0250776 A1 | 10/2009 | Takenaga et al. |
| 2009/0251829 A1 | 10/2009 | Zhang et al. |
| 2009/0257151 A1 | 10/2009 | Zhang et al. |
| 2010/0034014 A1 | 2/2010 | Ohno et al. |
| 2010/0035085 A1 | 2/2010 | Jung et al. |
| 2010/0080036 A1 | 4/2010 | Liu et al. |
| 2010/0080048 A1 | 4/2010 | Liu et al. |
| 2010/0086809 A1 | 4/2010 | Kuboki |
| 2010/0096716 A1 | 4/2010 | Ranjan et al. |
| 2010/0102406 A1 | 4/2010 | Xi et al. |
| 2010/0109110 A1 | 5/2010 | Wang et al. |
| 2010/0110783 A1 | 5/2010 | Liu et al. |
| 2010/0140726 A1 | 6/2010 | Apalkov et al. |
| 2010/0148167 A1 | 6/2010 | Whig et al. |
| 2010/0171086 A1 | 7/2010 | Lung et al. |
| 2010/0176472 A1 | 7/2010 | Shoji |
| 2010/0177557 A1 | 7/2010 | Liu et al. |
| 2010/0177561 A1 | 7/2010 | Liu et al. |
| 2010/0200899 A1 | 8/2010 | Marukame et al. |
| 2010/0219491 A1 | 9/2010 | Lee et al. |
| 2010/0220516 A1 | 9/2010 | Lee et al. |
| 2010/0230769 A1 | 9/2010 | Ozaki et al. |
| 2010/0240151 A1 | 9/2010 | Belen et al. |
| 2010/0276771 A1 | 11/2010 | Fukumoto et al. |
| 2010/0327248 A1 | 12/2010 | Khoueir et al. |
| 2010/0328822 A1 | 12/2010 | Park et al. |
| 2011/0007429 A1 | 1/2011 | Dimitrov et al. |
| 2011/0007543 A1 | 1/2011 | Khoury |
| 2011/0014500 A1 | 1/2011 | Horng et al. |
| 2011/0031569 A1 | 2/2011 | Watts et al. |
| 2011/0044099 A1 | 2/2011 | Dieny |
| 2011/0049657 A1 | 3/2011 | Tsukamoto et al. |
| 2011/0049658 A1 | 3/2011 | Zheng et al. |
| 2011/0051503 A1 | 3/2011 | Hu et al. |
| 2011/0062537 A1 | 3/2011 | Oh et al. |
| 2011/0064969 A1* | 3/2011 | Chen .............. B82Y 25/00 428/800 |
| 2011/0086439 A1 | 4/2011 | Choi |
| 2011/0096443 A1 | 4/2011 | Zhang et al. |
| 2011/0121366 A1 | 5/2011 | Or-Bach et al. |
| 2011/0145514 A1 | 6/2011 | Lee et al. |
| 2011/0149646 A1 | 6/2011 | Liu et al. |
| 2011/0149647 A1* | 6/2011 | Kim .............. H01L 43/08 365/171 |
| 2011/0149670 A1 | 6/2011 | Heo et al. |
| 2011/0151280 A1 | 6/2011 | Takahashi et al. |
| 2011/0170339 A1 | 7/2011 | Wunderlich et al. |
| 2011/0170341 A1 | 7/2011 | Butler |
| 2011/0194329 A1 | 8/2011 | Ohba et al. |
| 2011/0241138 A1 | 10/2011 | Hsieh et al. |
| 2011/0260274 A1 | 10/2011 | Zheng et al. |
| 2011/0266642 A1 | 11/2011 | Viala et al. |
| 2011/0269251 A1 | 11/2011 | Kim et al. |
| 2011/0293967 A1 | 12/2011 | Zhang et al. |
| 2011/0298456 A1 | 12/2011 | Lu et al. |
| 2011/0303995 A1 | 12/2011 | Worledge |
| 2011/0303997 A1 | 12/2011 | Wang et al. |
| 2011/0309418 A1 | 12/2011 | Nakayama et al. |
| 2012/0012952 A1 | 1/2012 | Chen et al. |
| 2012/0012953 A1 | 1/2012 | Lottis et al. |
| 2012/0012954 A1 | 1/2012 | Yamada et al. |
| 2012/0015099 A1 | 1/2012 | Sun et al. |
| 2012/0018823 A1 | 1/2012 | Huai et al. |
| 2012/0018825 A1 | 1/2012 | Lim et al. |
| 2012/0040207 A1 | 2/2012 | Horng et al. |
| 2012/0061781 A1* | 3/2012 | Ohmori .............. G11C 11/14 257/421 |
| 2012/0068139 A1 | 3/2012 | Daibou et al. |
| 2012/0069647 A1 | 3/2012 | Kramer et al. |
| 2012/0074511 A1 | 3/2012 | Takahashi et al. |
| 2012/0075922 A1 | 3/2012 | Yamada et al. |
| 2012/0075927 A1 | 3/2012 | Chen et al. |
| 2012/0106233 A1 | 5/2012 | Katti |
| 2012/0112297 A1 | 5/2012 | Yamakawa et al. |
| 2012/0134201 A1 | 5/2012 | Ogimoto |
| 2012/0135273 A1 | 5/2012 | Horng et al. |
| 2012/0146167 A1 | 6/2012 | Huai et al. |
| 2012/0155156 A1 | 6/2012 | Watts et al. |
| 2012/0164485 A1 | 6/2012 | Lin |
| 2012/0205758 A1 | 8/2012 | Jan et al. |
| 2012/0217594 A1 | 8/2012 | Kajiyama |
| 2012/0217599 A1 | 8/2012 | Nam et al. |
| 2012/0218813 A1 | 8/2012 | Oh et al. |
| 2012/0225499 A1 | 9/2012 | Nozieres et al. |
| 2012/0236631 A1 | 9/2012 | Park et al. |
| 2012/0241878 A1 | 9/2012 | Hu et al. |
| 2012/0261777 A1 | 10/2012 | Shukh |
| 2012/0267733 A1 | 10/2012 | Hu et al. |
| 2012/0280336 A1 | 11/2012 | Jan et al. |
| 2012/0286382 A1 | 11/2012 | Jan et al. |
| 2012/0299134 A1 | 11/2012 | Jan et al. |
| 2012/0299137 A1 | 11/2012 | Worledge |
| 2012/0300542 A1 | 11/2012 | Uchida et al. |
| 2013/0005052 A1 | 1/2013 | Hu et al. |
| 2013/0028013 A1 | 1/2013 | Ikeda et al. |
| 2013/0032911 A1 | 2/2013 | Jung et al. |
| 2013/0042081 A1 | 2/2013 | Park et al. |
| 2013/0059168 A1 | 3/2013 | Tahmasebi et al. |
| 2013/0064011 A1 | 3/2013 | Liu et al. |
| 2013/0069185 A1 | 3/2013 | Saida et al. |
| 2013/0075839 A1 | 3/2013 | Chen et al. |
| 2013/0134534 A1 | 5/2013 | Sbiaa et al. |
| 2013/0140658 A1 | 6/2013 | Yamane et al. |
| 2013/0146996 A1 | 6/2013 | Yu et al. |
| 2013/0148418 A1 | 6/2013 | Luo et al. |
| 2013/0177781 A1 | 7/2013 | Chepulskyy et al. |
| 2013/0209836 A1 | 8/2013 | Ataka et al. |
| 2013/0221459 A1 | 8/2013 | Jan et al. |
| 2013/0228884 A1 | 9/2013 | Zheng et al. |
| 2013/0229866 A1 | 9/2013 | Ranjan et al. |
| 2013/0242435 A1 | 9/2013 | Fuji et al. |
| 2013/0250661 A1 | 9/2013 | Sandhu et al. |
| 2013/0288392 A1 | 10/2013 | Nozieres et al. |
| 2013/0313665 A1 | 11/2013 | Rhie et al. |
| 2013/0314815 A1 | 11/2013 | Yuan et al. |
| 2013/0334630 A1 | 12/2013 | Kula et al. |
| 2013/0334631 A1 | 12/2013 | Kinney et al. |
| 2014/0008742 A1 | 1/2014 | Chen et al. |
| 2014/0015076 A1 | 1/2014 | Gan et al. |
| 2014/0021426 A1 | 1/2014 | Lee et al. |
| 2014/0027869 A1 | 1/2014 | Lee et al. |
| 2014/0038312 A1 | 2/2014 | Lee et al. |
| 2014/0063656 A1 | 3/2014 | Hashimoto |
| 2014/0064047 A1 | 3/2014 | Niwa et al. |
| 2014/0070341 A1 | 3/2014 | Beach et al. |
| 2014/0084398 A1* | 3/2014 | Oguz .............. H01L 43/12 257/421 |
| 2014/0099735 A1 | 4/2014 | Horng et al. |
| 2014/0116984 A1 | 5/2014 | Ding et al. |
| 2014/0151843 A1 | 6/2014 | Millward et al. |
| 2014/0157065 A1 | 6/2014 | Ong |
| 2014/0217526 A1 | 8/2014 | Guo |
| 2014/0242419 A1 | 8/2014 | Singh et al. |
| 2014/0264663 A1 | 9/2014 | Chen et al. |
| 2014/0268301 A1 | 9/2014 | Ding et al. |
| 2014/0269064 A1 | 9/2014 | Jeon et al. |
| 2014/0272454 A1 | 9/2014 | Zhang et al. |
| 2014/0287537 A1 | 9/2014 | Shukh |
| 2014/0293436 A1 | 10/2014 | Nagahama et al. |
| 2014/0308542 A1 | 10/2014 | Zhang et al. |
| 2014/0327095 A1* | 11/2014 | Kim .............. H01L 43/08 257/421 |
| 2014/0334032 A1 | 11/2014 | Nishioka et al. |

(56) References Cited

U.S. PATENT DOCUMENTS

| | | |
|---|---|---|
| 2014/0339504 A1 | 11/2014 | Kim et al. |
| 2014/0367814 A1 | 12/2014 | Ohmori et al. |
| 2015/0028439 A1 | 1/2015 | Kula et al. |
| 2015/0041933 A1 | 2/2015 | Chepulskyy et al. |
| 2015/0069556 A1 | 3/2015 | Yamakawa et al. |
| 2015/0076633 A1 | 3/2015 | Siddik et al. |
| 2015/0179916 A1 | 6/2015 | Pramanik et al. |
| 2015/0270478 A1 | 9/2015 | Annunziata et al. |
| 2015/0287910 A1 | 10/2015 | Lu et al. |
| 2015/0295164 A1* | 10/2015 | Sandhu .......... H01L 43/02 257/421 |
| 2015/0340601 A1 | 11/2015 | Huai et al. |
| 2016/0005954 A1 | 1/2016 | Erickson et al. |
| 2016/0086645 A1 | 3/2016 | Erickson et al. |
| 2016/0155932 A1 | 6/2016 | Chen et al. |

FOREIGN PATENT DOCUMENTS

| | | |
|---|---|---|
| CN | 102246327 A | 11/2011 |
| CN | 104241286 A | 12/2014 |
| EP | 1353443 A2 | 10/2003 |
| EP | 1801895 A2 | 6/2007 |
| EP | 2385548 A1 | 11/2011 |
| EP | 2541554 A1 | 1/2013 |
| EP | 2015307 B1 | 4/2013 |
| GB | 2343308 A | 5/2000 |
| JP | 2002314049 A | 10/2002 |
| JP | 2004104076 A | 4/2004 |
| JP | 2006165059 A | 6/2006 |
| JP | 2007-173843 A | 7/2007 |
| JP | 2008-198792 A | 8/2008 |
| JP | 2008270835 A | 11/2008 |
| JP | 2009194366 A | 8/2009 |
| JP | 2010-087355 A | 4/2010 |
| JP | 2012-142480 A | 7/2012 |
| JP | 2012244031 A | 12/2012 |
| JP | 2013145846 A | 7/2013 |
| KR | 1020040092342 A | 11/2004 |
| KR | 1020070094431 A | 9/2007 |
| KR | 1020080029852 A | 4/2008 |
| KR | 1020120008295 A | 1/2012 |
| KR | 10-2012-0130701 A | 12/2012 |
| WO | 2010/026667 A1 | 3/2010 |
| WO | 2010026831 A1 | 3/2010 |
| WO | 2010134378 A1 | 11/2010 |
| WO | 2011001746 A1 | 1/2011 |
| WO | 2011149274 A2 | 12/2011 |
| WO | 2011159422 A1 | 12/2011 |
| WO | 2012128891 A1 | 9/2012 |
| WO | 2012160937 A1 | 11/2012 |

OTHER PUBLICATIONS

Auwarter et al., Co on h-BN/Ni(1 1 1): From Island to Island-Chain Formation and Co Intercalation, Surface Science, vol. 511, (2002), pp. 379-386.

Bai et al., Boron Diffusion Induced Symmetry Reduction and Scattering in CoFeB/MgO/CoFeB Magnetic Tunnel Junctions, Phys. Rev. B, vol. 87, (Jan. 23, 2013), pp. 014114 (abstract only).

Braun et al., Strain-Induced Perpendicular Magnetic Anisotropy in Ultrathin Ni Films on Cu3Au(0 0 1), Journal of Magnetism and Magnetic Materials, vol. 171, (1997), pp. 16-28.

Carrey et al., Influence of Interface Alloying on the Magnetic Properties of Co/Pd Multilayers, Applied Physics Letters, vol. 83, No. 25, (Dec. 22, 2003), pp. 5259-5261.

Cha et al., Atomic-Scale Spectroscopic Imaging of CoFeB/Mg-B-O/CoFeB Magnetic Tunnel Junctions, Applied Physics Letters, vol. 95, (2009), pp. 032506-1-032506-3.

Diao et al., Spin Transfer Switching in Dual MgO Magnetic Tunnel Junctions, Applied Physics Letters, vol. 90, (2007), pp. 132508-1-132508-3.

Djayaprawira et al., 230% Room-Temperature Magnetoresistance in CoFeB/MgO/CoFeB Magnetic Tunnel Junctions, Applied Physics Letters, vol. 86, Issue 9, (2005), 2 pages, (abstract only).

Farle et al., The Temperature Dependence of Magnetic Anisotropy in Ultra-Thin Films, Journal of Magnetism and Magnetic Materials, vol. 165, (1997), pp. 74-77.

Hayakawa et al., Dependence of Giant Tunnel Magnetoresistance of Sputtered CoFeB/MgO/CoFeB Magnetic Tunnel Junctions on MgO Barrier Thickness and Annealing Temperature, Japanese Journal of Applied Physics, vol. 44, No. 19, (2005), pp. L587-L589.

Heczko et al., Strain and Concurrent Magnetization Changes in Magnetic Shape Memory Ni-Mn-Ga Single Crystals—Experiment and Model, Materials Science and Engineering A, vol. 481-482, (2008), pp. 283-287.

Hendrych et al., Magnetic Behavior and Domain Structure in As-Quenched, Annealed, and Stress-Annealed CoFeCrSiB Ribbons, Journal of Magnetism and Magnetic Materials, vol. 321, (2009), pp. 3771-3777.

Kim et al., Enhancement of Data Retention and Write Current Scaling for Sub-20nm STT-MRAM by Utilizing Dual Interfaces for Perpendicular Magnetic Anisotropy, VLSI Technology (VLSIT), 2012 Symposium, (Jun. 12-14, 2012), 1 page, (abstract only).

Ko et al., Effects of MgO and MgO/Pd Seed-Layers on Perpendicular Magnetic Anisotropy of CoPd Thin Films, Thin Solid Films, vol. 519, (2011), pp. 8252-8255.

Kohda et al., Width and Temperature Dependence of Lithography-Induced Magnetic Anisotropy in (Ga,Mn)As Wires, Physica E, vol. 42, (2010), pp. 2685-2689.

Lavrijsen et al., Tuning the Interlayer Exchange Coupling Between Single Perpendicularly Magnetized CoFeB Layers, Appl. Phys. Lett., vol. 100, (2012), pp. 052411-1-052411-5.

Löhndorf et al., Characterization of Magnetostrictive TMR Pressure Sensors by MOKE, Journal of Magnetism and Magnetic Materials, vol. 316, (2007), pp. e223-e225.

Ma et al., NiO-Thickness Dependent Magnetic Anisotropies in Fe/NiO/Au(001) and Fe/NiO/MgO(001) Systems, Journal of Magnetism and Magnetic Materials, vol. 324, (2012), pp. 528-533.

Maehara et al., Tunnel Magnetoresistance Above 170% and Resistance-Area Product of 1 Ω (μm)2 Attained by In Situ Annealing of Ultra-Thin MgO Tunnel Barrier, Applied Physics Express, vol. 4, (2011), 2 pages, (abstract only).

Matsumoto et al., Dependence on Annealing Temperatures of Tunneling Spectra in High-Resistance CoFeB/MgO/CoFeB Magnetic Tunnel Junctions, Solid State Communications, vol. 143, (2007), pp. 574-578.

Matsumoto et al., Tunneling Spectra of Sputter-Deposited CoFeB/MgO/CoFeB Magnetic Tunnel Junctions Showing Giant Tunneling Magnetoresistance Effect, Solid State Communications, vol. 136, (2005), pp. 611-615.

Miracle et al., An Assessment of Binary Metallic Glasses: Correlations Between Structure, Glass Forming Ability and Stability (Preprint), Air Force Research Laboratory, (2011), 97 pages.

Miura et al., CoFeB/MgO Based Perpendicular Magnetic Tunnel Junctions with Stepped Structure for Symmetrizing Different Retention Times of "0" and "1" Information, 2011 Symposium on VLSI Technology (VLSIT), (Jun. 14-16, 2011), 19 pages.

Moroz et al., Modeling the Impact of Stress on Silicon Processes and Devices, Materials Science in Semiconductor Processing, vol. 6, (2003), pp. 27-36.

Moutis et al., Voltage-Induced Modification in Magnetic Coercivity of Patterned Co50Fe50 Thin Film on Piezoelectric Substrate, Journal of Magnetism and Magnetic Materials, vol. 320, (2008), pp. 1050-1055.

Nishitani et al., Magnetic Anisotropy in a Ferromagnetic (Ga,Mn)Sb Thin Film, Physica E, vol. 42, (2010), pp. 2681-2684.

Piramanayagam, S. N., Perpendicular Recording Media for Hard Disk Drives, Journal of Applied Physics, vol. 102, (2007), pp. 011301-1-011301-22.

Resnik et al., Mechanical Stress in Thin Film Microstructures on Silicon Substrate, Vacuum, vol. 80, (2005), pp. 236-240.

Sandhu et al., Memory Cells, Methods of Fabrication, Semiconductor Devices, Memory Systems, and Electronic Systems, U.S. Appl. No. 14/026,627, filed Sep. 13, 2013.

(56) References Cited

OTHER PUBLICATIONS

Sandhu et al., Memory Cells, Semiconductor Structures, Semiconductor Devices, and Methods of Fabrication, U.S. Appl. No. 14/249,183, filed Apr. 9, 2014.
Stone et al., Tuning of Ferromagnetism Through Anion Substitution in Ga-Mn-Pnictide Ferromagnetic Semiconductors, Physica B, vol. 401-402, (2007), pp. 454-457.
Tao et al., Uniform Wafer-Scale Chemical Vapor Deposition of Graphene on Evaporated Cu (1 1 1) Film with Quality Comparable to Exfoliated Monolayer, J. Physical Chemistry, vol. 116, (2012), pp. 24068-24074.
Vitos et al., The Surface Energy of Metals, Surface Science, vol. 411, (1998), pp. 186-202.
Wang et al., C-Spin Kickoff Meeting Presentation, Semiconductor Research Corp., (Mar. 26, 2013), Minneapolis, Minnesota, (available at https://www.src.org/library/publication/p066203/), 195 pages.
Wilson et al., New Materials for Micro-Scale Sensors and Actuators: An Engineering Review, Materials Science and Engineering R, vol. 56, (2007), pp. 1-129.
Worledge et al., Spin Torque Switching of Perpendicular Ta|CoFeB|MgO-Based Magnetic Tunnel Junctions, Applied Physics Letters, vol. 98, (2011), pp. 022501-1-022501-3.
You et al., Spin Transfer Torque and Tunneling Magnetoresistance Dependences on Finite Bias Voltages and Insulator Barrier Energy, Thin Solid Films, vol. 519, (2011), pp. 8247-8251.
Yu et al., 1/f Noise in MgO Double-Barrier Magnetic Tunnel Junctions, Applied Physics Letters, vol. 98, (2011), pp. 112504-1-112504-3.
Zhang, Anisotropic Magnetomechanical Effect in Tb0.3Dy0.7Fe2 Alloy, Journal of Magnetism and Magnetic Materials, vol. 324, (2012), pp. 190-195.
Zhu et al., Magnetic Tunnel Junctions, MaterialsToday, vol. 9, No. 11, (Nov. 2006), pp. 36-45.
Kim et al., Effect of Annealing on Magnetic Exchange Coupling in CoPt/Co Bilayer Thin Films, Journal of Applied Physics, vol. 87, No. 9, (May 1, 2000), pp. 6140-6142.
Rodmacq et al., Influence of Thermal Annealing on the Perpendicular Magnetic Anisotropy of Pt/Co/AlOx Trilayers, Physical Review B, vol. 79, (2009), pp. 024423-1-024423-8.
Wang et al., Exchange Coupling Between Ferromagnetic and Antiferromagnetic Layers Via Ru and Application for a Linear Magnetic Field Sensor, Journal of Applied Physics, vol. 99, (2006), pp. 08H703-1-08H703-3.
Wu et al., Tuning Magnetic Anisotropies of Fe Films on Si(1 1 1) Substrate Via Direction Variation of Heating Current, Scientific Reports, vol. 3, (Mar. 26, 2013), pp. 1-5.
Chen et al., Advances and Future Prospects of Spin-Transfer Torque Random Access Memory, IEEE Transactions of Magnetics, vol. 46, No. 6, (Jun. 2010), pp. 1873-1878.
Chen et al., "Magnetic Cell Structures, and Methods of Fabrication," U.S. Appl. No. 14/558,367, filed Dec. 2, 2014.
Ke et al., Oxygen-Vacancy-Induced Diffusive Scattering in Fe/MgO/Fe Magnetic Tunnel Junctions, Physical Review Letters, vol. 105, (Nov. 30, 2010), pp. 236801-1-236801-4.
Meade et al., Memory Cells, Methods of Fabrication, and Semiconductor Devices, U.S. Appl. No. 14/256,655, filed Apr. 18, 2014.
Miao et al., Disturbance of Tunneling Coherence by Oxygen Vacancy in Epitaxial Fe/MgO/Fe Magnetic Tunnel Junctions, Physical Review Letters, vol. 100, (Jun. 19, 2008), pp. 246803-1-246803-4.
Sandhu et al., Memory Cells, Semiconductor Devices, and Methods of Fabrication, U.S. Appl. No. 14/516,347, filed Oct. 16, 2014.
Siddik et al., Semiconductor Devices, Magnetic Tunnel Junctions, and Methods of Fabrication Thereof, U.S. Appl. No. 14/597,903, filed Jan. 15, 2015.
Gan et al., Origin of the Collapse of Tunnel Magnetoresistance at High Annealing Temperature in CoFeB/MgO Perpendicular Magnetic Tunnel Junctions, Applied Physics letters, vol. 99, (2011), pp. 252507-1-252507-3.
Gao et al., Combinatorial Exploration of Rare-Earth-Free Permanent Magnets: Magnetic and Microstructural Properties of Fe—Co—W Thin Films, Applied Physics Letters, vol. 102, (2013), pp. 022419-1-022419-4.
Ikeda et al., Tunnel Magnetoresistance of 604% at 300 K by Suppression of Ta Diffusion in CoFeB/MgO/CoFeB Pseudo-Spin-Valves Annealed at High Temperature, Applied Physics Letters, vol. 93, (2008), pp. 082508-1-082508-3.
Kula et al., Memory Cells, Methods of Fabrication, Semiconductor Device Structures, Memory Systems, and Electronic Systems, U.S. Appl. No. 13/948,839, filed Jul. 23, 2014.
Sato et al., Perpendicular-Anisotropy CoFeB—MgO Magnetic Tunnel Junctions with a MgO/CoFeB/Ta/CoFeB/MgO Recording Structure, Applied Physics Letters, vol. 101, (2012), pp. 022414-022414-4.
Siddik et al., Memory Cells, Methods of Fabrication, and Semiconductor Devices, U.S. Appl. No. 14/030,763, filed Sep. 18, 2013.
Worledge et al., Magnetoresistance Measurement of Unpatterned Magnetic Tunnel Junction Wafers by Current-in-Plane Tunneling, Applied Physics Letters, vol. 83, No. 1, (Jul. 7, 2013), pp. 84-86.
International Search Report for International Application No. PCT/US2015/017260, (dated May 15, 2015), 4 pages.
International Written Opinion for International Application No. PCT/US2015/017260, (dated May 15, 2015), 8 pages.
Ando et al., "Electrically Tunable Spin Injector Free from the Impedence Mismatch Problem," Nature Materials, vol. 10 (Sep. 2011), pp. 655-659.
Butler et al., "Spin-Dependent Tunneling Conductance of Fe|MgO|Fe Sandwiches," Physical Review B, vol. 63, (Jan. 8, 2001), 054416-1-054416-12.
Hindmarch et al., "Zirconium as a Boron Sink in Crystalline CoFeB/MgO/CoFeB Magnetic Tunnel Junctions," Applied Physics Express, vol. 4, (2011), pp. 013002-1-013002-3.
Kaufman, Myron, "Principles of Thermodynamics," Taylor & Francis Group LLC, (2002), Chap. 7: Chemical Reactions, 9 pages.
"Knovel Sampler," Knovel, (2003), http://app.knovel.com/web/view/html/show.v/rcid:kpKS000009/cid:kt003BCMZ2/viewerType:html/root_slug:front-matter/url_slug:front-matter?b-q=ioniz . . . ; 2 pages.
Kurt et al., "Giant Tunneling Magnetoresistance with Electron Beam Evaporated MgO Barrier and CoFeB Electrodes," Journal of Applied Physics, No. 107, (Apr. 30, 2010), pp. 083920-1-083920-6.
Wang et al., "Low-Power Non-volatile Spintronic Memory: STT-MRAM and Beyond," J. Phys. D: Applied Physics, vol. 46, (Jan. 31, 2013), pp. 1-10.
Miao et al., Theoretical Investigation on the Transition-Metal Borides with Ta3B4-Type Structure: A Class of Hard and Refractory Materials, Computational Materials Science, vol. 50, (2011), pp. 1559-1566.
Tsunekawa et al., Effect of Capping Layer Material on Tunnel Magnetoresistance in CoFeB—MgO—CoFeB Magentic Tunnel Junctions, Digests of the IEEE International Magnetics Conference (Apr. 2005), pp. 1983-1984.
Greenwood et al., Chemistry of the Elements, 2d Ed., Butterworth-Heinemann, (1997), pp. 23-25.
Pinitsoontorn et al., Three-Dimensional Atom Probe Investigation of Boron Distribution in Co Fe B/ Mg O/ Co Fe B Magnetic Tunnel Junctions, Applied Physics Letters, vol. 93, (2008), pp. 071901-1-071901-3.
Decision of the Intellectual Property Office for Taiwanese Application No. 104106391, (dated Sep. 23, 2016), 14 pages including translation.
Lee et al., Improved Magnetic Tunnel Junction with Amorphous Seed Layer, Surface Treatment, and High-Polarization Magnetic Materials, IEEE Transactions on Magnetics, vol. 40, No. 4, (Jul. 2004), pp. 2275-2277.
Taiwan Search Report for ROC (Taiwan) Patent Application No. 104106391, (dated Jan. 17, 2016), 1 page.
Taiwanese Office Action from Taiwanese Application No. 104106391, dated Dec. 26, 2018, 19 pages.
Taiwanese Office Action and Search Report for Application No. 105100413 dated Oct. 7, 2016, 7 pages.
Isogami et al., "In situ heat treatment of ultrathin MgO layer for giant magnetoresistance ratio with low resistance area product in CoFeB/MgO/CoFeB magnetic tunnel junctions", Applied Physics Letters, vol. 93(19), (2008) pp. 192109-1-192109-3.

* cited by examiner

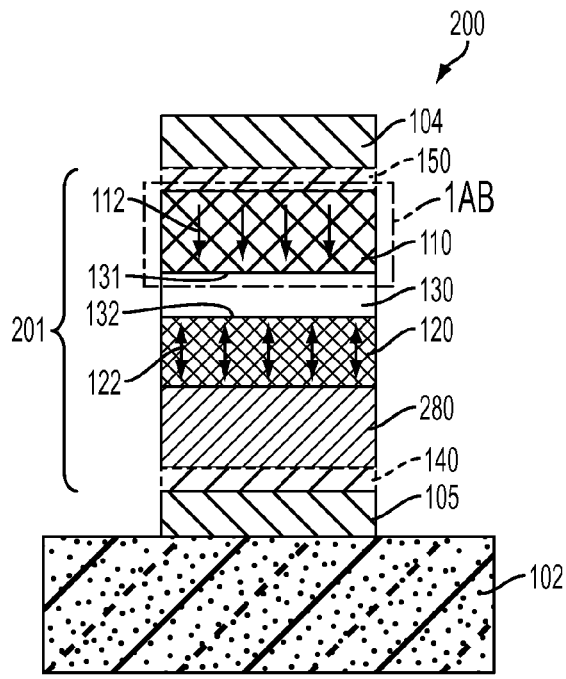
FIG. 2
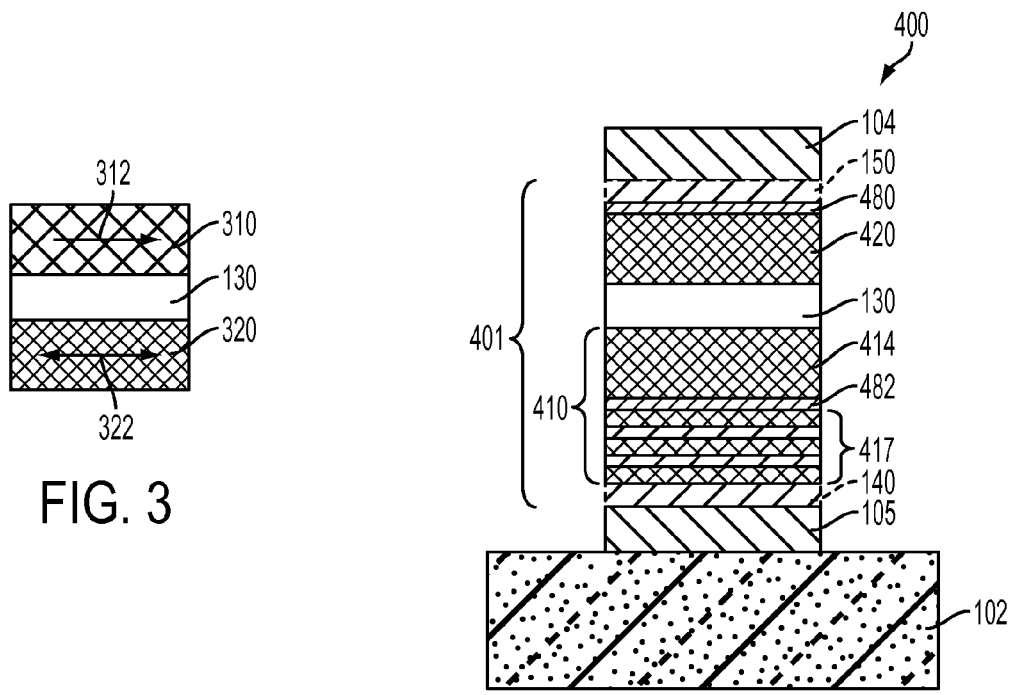
FIG. 3
FIG. 4

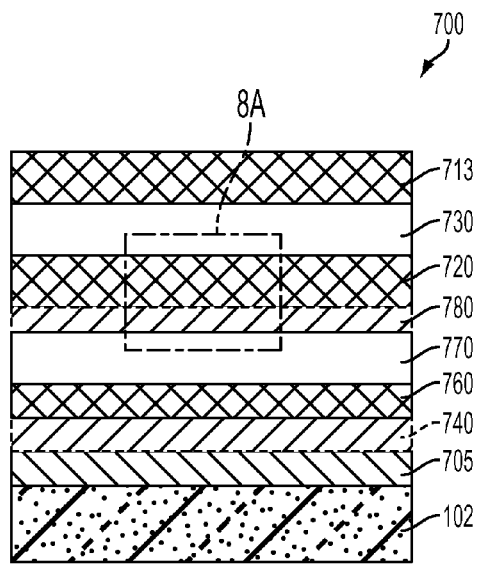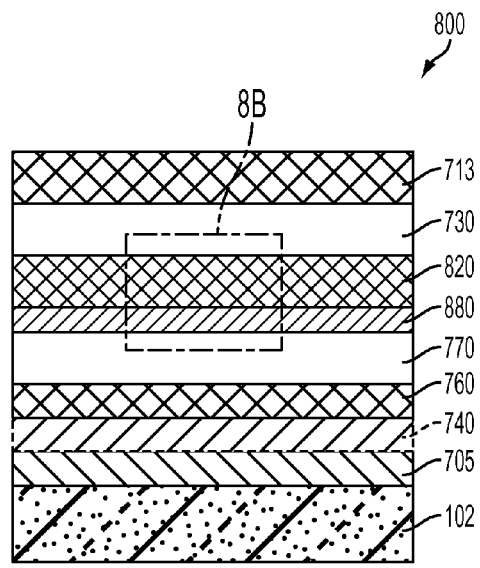
FIG. 7  FIG. 8
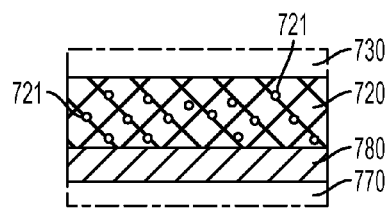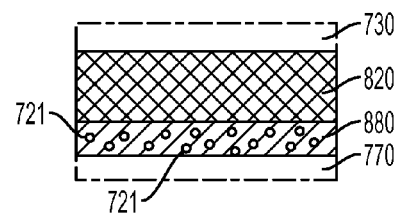
FIG. 8A  FIG. 8B

MEMORY CELLS, METHODS OF FABRICATION, AND MEMORY DEVICES

TECHNICAL FIELD

The present disclosure, in various embodiments, relates generally to the field of memory device design and fabrication. More particularly, this disclosure relates to design and fabrication of memory cells characterized as spin torque transfer magnetic random access memory (STT-MRAM) cells.

BACKGROUND

Magnetic Random Access Memory (MRAM) is a non-volatile computer memory technology based on magnetoresistance. One type of MRAM cell is a spin torque transfer MRAM (STT-MRAM) cell, which includes a magnetic cell core supported by a substrate. The magnetic cell core includes at least two magnetic regions, for example, a "fixed region" and a "free region," with a non-magnetic region between. The free region and the fixed region may exhibit magnetic orientations that are either horizontally oriented ("in-plane") or perpendicularly oriented ("out-of-plane") relative to the width of the regions. The fixed region includes a magnetic material that has a substantially fixed (e.g., a non-switchable) magnetic orientation. The free region, on the other hand, includes a magnetic material that has a magnetic orientation that may be switched, during operation of the cell, between a "parallel" configuration and an "anti-parallel" configuration. In the parallel configuration, the magnetic orientations of the fixed region and the free region are directed in the same direction (e.g., north and north, east and east, south and south, or west and west, respectively). In the "anti-parallel" configuration, the magnetic orientations of the fixed region and the free region are directed in opposite directions (e.g., north and south, east and west, south and north, or west and east, respectively). In the parallel configuration, the STT-MRAM cell exhibits a lower electrical resistance across the magnetoresistive elements (e.g., the fixed region and free region). This state of low electrical resistance may be defined as a "0" logic state of the MRAM cell. In the anti-parallel configuration, the STT-MRAM cell exhibits a higher electrical resistance across the magnetoresistive elements. This state of high electrical resistance may be defined as a "1" logic state of the STT-MRAM cell.

Switching of the magnetic orientation of the free region may be accomplished by passing a programming current through the magnetic cell core and the fixed and free regions therein. The fixed region polarizes the electron spin of the programming current, and torque is created as the spin-polarized current passes through the core. The spin-polarized electron current exerts the torque on the free region. When the torque of the spin-polarized electron current passing through the core is greater than a critical switching current density ($J_c$) of the free region, the direction of the magnetic orientation of the free region is switched. Thus, the programming current can be used to alter the electrical resistance across the magnetic regions. The resulting high or low electrical resistance states across the magnetoresistive elements enable the write and read operations of the MRAM cell. After switching the magnetic orientation of the free region to achieve the one of the parallel configuration and the anti-parallel configuration associated with a desired logic state, the magnetic orientation of the free region is usually desired to be maintained, during a "storage" stage, until the MRAM cell is to be rewritten to a different configuration (i.e., to a different logic state).

A magnetic region's magnetic anisotropy ("MA") is an indication of the directional dependence of the material's magnetic properties. Therefore, the MA is also an indication of the strength of the material's magnetic orientation and of its resistance to alteration of its orientation. A magnetic material exhibiting a magnetic orientation with a high MA strength may be less prone to alteration of its magnetic orientation than a magnetic material exhibiting a magnetic orientation with a low MA strength. Therefore, a free region with a high MA strength may be more stable during storage than a free region with a low MA strength.

Interaction between certain nonmagnetic material (e.g., oxide material) and magnetic material may induce MA (e.g., increase MA strength) along a surface of the magnetic material, adding to the overall MA strength of the magnetic material and the MRAM cell. Generally, the greater the ratio of the magnetic material in contact with the surface/interface MA-inducing material to the non-contacted portion of the magnetic material, the higher the MA strength of the magnetic region. Therefore, generally, conventional magnetic cell structures directly contact the magnetic material of, e.g., the free region, to a neighboring MA-inducing oxide region, without another material between the magnetic material and the MA-inducing material.

Other beneficial properties of free regions are often associated with the microstructure of the free regions. These properties include, for example, the cell's tunnel magnetoresistance ("TMR"). TMR is a ratio of the difference between the cell's electrical resistance in the anti-parallel configuration ($R_{ap}$) and its resistance in the parallel configuration ($R_p$) to $R_p$ (i.e., TMR=$(R_{ap}-R_p)/R_p$). Generally, a free region with a consistent crystalline structure (e.g., a bcc (001) crystalline structure) having few structural defects in the microstructure of its magnetic material has a higher TMR than a thin free region with structural defects. A cell with high TMR may have a high read-out signal, which may speed the reading of the MRAM cell during operation. High TMR may also enable use of low programming current.

Efforts have been made to form free regions having high MA strength and that have microstructures that are conducive for high TMR. For example, a high temperature (e.g., greater than about 500° C.) anneal of a magnetic material may promote crystallization of the magnetic material, which crystallization may enable high TMR. Annealing oxide material in the MRAM cell to be formed may also improve the crystal structure of the oxide material and further enable high TMR. However, the high temperatures of the anneal may also lead to degradation of other materials. Furthermore, consistent crystallization of the magnetic material may be hindered if neighboring materials have microstructures that conflict with the desired crystalline structure of the magnetic material. Thus, forming MRAM cell structures having high TMR and high MA strength has presented challenges.

BRIEF DESCRIPTION OF THE DRAWINGS

FIG. 2 is a cross-sectional, elevational, schematic illustration of a magnetic cell structure according to an embodiment of the present disclosure, wherein the magnetic cell structure includes a fixed region overlying a free region, a single oxide region proximate to the free region, and an attracter region also proximate to the free region.

FIG. 3 is a cross-sectional, elevational, schematic illustration of a section of a magnetic cell structure according to an embodiment of the present disclosure, wherein a free region and a fixed region exhibit in-plane magnetic orientations.

FIG. 4 is a cross-sectional, elevational, schematic illustration of a magnetic cell structure according to an embodiment of the present disclosure, wherein the magnetic cell structure includes a fixed region underlying a free region, a single oxide region proximate to the free region, an attracter region also proximate to the free region, and another attracter region proximate to the fixed region.

FIGS. 7 through 9 are cross-sectional, elevational, schematic illustrations during various stages of processing to fabricate the magnetic cell structure of FIGS. 1 and 1A, according to an embodiment of the present disclosure, wherein:

FIG. 7 is a cross-sectional, elevational, schematic illustration of a structure during a stage of processing;

FIG. 8 is a cross-sectional, elevational, schematic illustration of an annealed structure during a stage of processing subsequent to that of FIG. 7;

FIG. 8A is an enlarged view of box 8A of FIG. 7;

FIG. 8B is an enlarged view of box 8B of FIG. 8; and

FIG. 9 is a cross-sectional, elevational, schematic illustration of a precursor structure during a stage of processing subsequent to that of FIG. 8.

FIGS. 10A through 12B are cross-sectional, elevational, schematic illustrations during various stage of processing to fabricate the magnetic cell structure of FIGS. 1 and 1C, according to an embodiment of the present disclosure, wherein:

FIG. 10A is a cross-sectional, elevational, schematic illustration of a structure during a stage of processing;

FIG. 11 is a cross-sectional, elevational, schematic illustration of an oxidized structure during a stage of processing subsequent to that of FIG. 10B;

FIG. 12B is a cross-sectional, elevational, schematic illustration of an annealed structure during a stage of processing subsequent to that of FIG. 12A.

FIGS. 13 and 14 are cross-sectional, elevational, schematic illustrations during various stages of processing to fabricate the magnetic cell structure of FIG. 2, according to an embodiment of the present disclosure, wherein:

FIG. 13 is a cross-sectional, elevational, schematic illustration of a structure during a stage of processing; and FIG. 14 is a cross-sectional, elevational, schematic illustration of an annealed structure during a stage of processing subsequent to that of FIG. 13.

FIGS. 15 and 16 are cross-sectional, elevational, schematic illustrations during various stages of processing to fabricate the magnetic cell structure of FIG. 4 or FIG. 5, according to an embodiment of the present disclosure, wherein:

FIG. 15 is a cross-sectional, elevational, schematic illustration of a structure during a stage of processing; and FIG. 16 is a cross-sectional, elevational, schematic illustration of an annealed structure during a stage of processing subsequent to that of FIG. 15.

DETAILED DESCRIPTION

Figure 1:
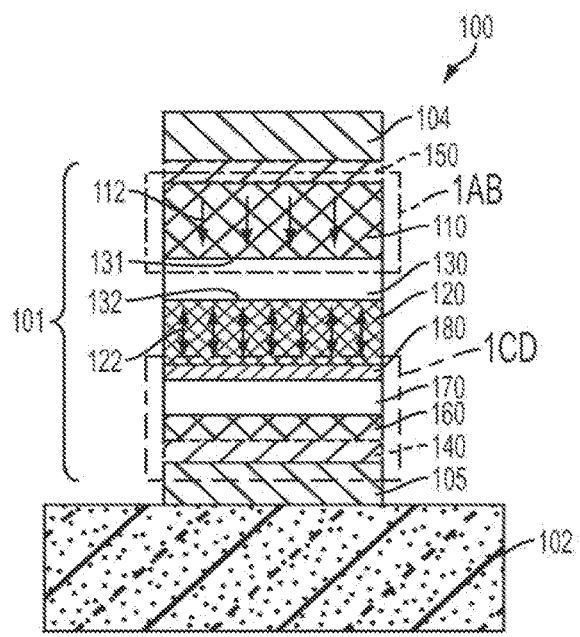
FIG. 1 is a cross-sectional, elevational, schematic illustration of a magnetic cell structure according to an embodiment of the present disclosure, wherein the magnetic cell structure includes a fixed region overlying a free region, dual oxide regions, and an attracter region proximate to one of the dual oxide regions and the free region.

Memory cells, methods of forming memory cells, semiconductor devices, memory systems, and electronic systems are disclosed. During fabrication of the memory cell, a "diffusible species" is at least partially removed from magnetic material, which may also be characterized as a "precursor magnetic material," due to proximity of the precursor magnetic material to an attracter material that has a higher chemical affinity for the diffusible species than other species in the precursor magnetic material. The removal of the diffusible species from the precursor magnetic material, which forms what may be characterized as a "depleted magnetic material," promotes crystallization of the depleted magnetic material into a desired crystalline structure (e.g., a bcc (001) structure). Moreover, the attracter material may have a microstructure, e.g., an amorphous microstructure, that does not adversely impact the magnetic material's ability to crystallize into the desired crystalline structure. Thus, the depleted magnetic material may be crystallized into a microstructure that enables a memory cell including the depleted magnetic material to have high tunnel magnetoresistance ("TMR") and to have magnetic anisotropy ("MA") induced, along interfaces of the magnetic material (e.g., the depleted magnetic material), by one or more neighboring oxide materials.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, the term "STT-MRAM cell" means and includes a magnetic cell structure that includes a magnetic cell core including a nonmagnetic region disposed between a free region and a fixed region. The nonmagnetic region may be an electrically insulative (e.g., dielectric) region, in a magnetic tunnel junction ("MTJ") configuration. For example, the nonmagnetic region, between the free and fixed regions, may be an oxide region (referred to herein as the "intermediate oxide region").

As used herein, the term "secondary oxide region" refers to an oxide region of an STT-MRAM cell other than the intermediate oxide region. The secondary oxide region may be formulated and positioned to induce magnetic anisotropy ("MA") with a neighboring magnetic material.

As used herein, the terms "magnetic cell core" means and includes a memory cell structure comprising the free region and the fixed region and through which, during use and operation of the memory cell, current may be passed (i.e., flowed) to effect a parallel or anti-parallel configuration of the magnetic orientations of the free region and the fixed region.

As used herein, the term "magnetic region" means a region that exhibits magnetism. A magnetic region includes a magnetic material and may also include one or more non-magnetic materials.

As used herein, the term "magnetic material" means and includes ferromagnetic materials, ferrimagnetic materials, antiferromagnetic, and paramagnetic materials.

As used herein, the terms "CoFeB material" and "CoFeB precursor material" mean and include a material comprising cobalt (Co), iron (Fe), and boron (B) (e.g., $Co_xFe_yB_z$, wherein x=10 to 80, y=10 to 80, and z=0 to 50). A CoFeB material or a CoFeB precursor material may or may not exhibit magnetism, depending on its configuration (e.g., its thickness).

As used herein, the term "species" means and includes an element or elements from the Periodic Table of Elements composing a material. For example, and without limitation, in a CoFeB material, each of Co, Fe, and B may be referred to as species of the CoFeB material.

As used herein, the term "diffusible species" means and includes a chemical species of a material, the presence of which in the material is not necessary for the functionality of the material. For example, and without limitation, in a CoFeB material of a magnetic region, B (boron) may be referred to as a diffusible species to the extent that the presence of B in combination with Co and Fe is not necessary for the Co and Fe to function as a magnetic material (i.e., to exhibit magnetism). Following diffusion, the "diffusible species" may be referred to as a "diffused species."

As used herein, the term "chemical affinity" means and refers to the electronic property by which dissimilar chemical species tend to form chemical compounds. Chemical affinity may be indicated by the heat of formation of the chemical compound. For example, a first material described as having a higher chemical affinity for a diffusible species of a second material compared to the chemical affinity between the diffusible species and other species of the second material means and includes that a heat of formation of a chemical compound that includes the diffusible species and at least one species from the first material is lower than a heat of formation of a chemical compound that includes the diffusible species and the other species of the second material.

As used herein, the term "fixed region" means and includes a magnetic region within the STT-MRAM cell that includes a magnetic material and that has a fixed magnetic orientation during use and operation of the STT-MRAM cell in that a current or applied field effecting a change in the magnetization direction of one magnetic region (e.g., the free region) of the cell core may not effect a change in the magnetization direction of the fixed region. The fixed region may include one or more magnetic materials and, optionally, one or more non-magnetic materials. For example, the fixed region may be configured as a synthetic antiferromagnet (SAF) including a sub-region of ruthenium (Ru) adjoined by magnetic sub-regions. Alternatively, the fixed region may be configured with structures of alternating sub-regions of magnetic material and coupler material. Each of the magnetic sub-regions may include one or more materials and one or more regions therein. As another example, the fixed region may be configured as a single, homogeneous magnetic material. Accordingly, the fixed region may have uniform magnetization, or sub-regions of differing magnetization that, overall, effect the fixed region having a fixed magnetic orientation during use and operation of the STT-MRAM cell.

As used herein, the term "coupler material" means and includes a material formulated to antiferromagnetically couple neighboring magnetic material.

As used herein, the term "free region" means and includes a magnetic region within the STT-MRAM cell that includes a magnetic material and that has a switchable magnetic orientation during use and operation of the STT-MRAM cell. The magnetic orientation may be switched between a parallel configuration and an anti-parallel configuration by the application of a current or applied field.

As used herein, "switching" means and includes a stage of use and operation of the memory cell during which programming current is passed through the magnetic cell core of the STT-MRAM cell to effect a parallel or anti-parallel configuration of the magnetic orientations of the free region and the fixed region.

As used herein, "storage" means and includes a stage of use and operation of the memory cell during which programming current is not passed through the magnetic cell core of the STT-MRAM cell and in which the parallel or anti-parallel configuration of the magnetic orientations of the free region and the fixed region is not purposefully altered.

As used herein, the term "vertical" means and includes a direction that is perpendicular to the width and length of the respective region. "Vertical" may also mean and include a direction that is perpendicular to a primary surface of the substrate on which the STT-MRAM cell is located.

As used herein, the term "horizontal" means and includes a direction that is parallel to at least one of the width and length of the respective region. "Horizontal" may also mean and include a direction that is parallel to a primary surface of the substrate on which the STT-MRAM cell is located.

As used herein, the term "sub-region," means and includes a region included in another region. Thus, one magnetic region may include one or more magnetic sub-regions, i.e., sub-regions of magnetic material, as well as non-magnetic sub-regions, i.e., sub-regions of non-magnetic material.

As used herein, the term "between" is a spatially relative term used to describe the relative disposition of one material, region, or sub-region relative to at least two other materials, regions, or sub-regions. The term "between" can encompass both a disposition of one material, region, or sub-region directly adjacent to the other materials, regions, or sub-regions and a disposition of one material, region, or sub-region indirectly adjacent to the other materials, regions, or sub-regions.

As used herein, the term "proximate to" is a spatially relative term used to describe disposition of one material, region, or sub-region near to another material, region, or sub-region. The tem). "proximate" includes dispositions of indirectly adjacent to, directly adjacent to, and internal to.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" or "directly adjacent to" another element, there are no intervening elements present.

As used herein, other spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, etc.) and the spatially relative descriptors used herein interpreted accordingly.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, "and/or" includes any and all combinations of one or more of the associated listed items.

As used herein, the singular terms "a," "an," and "the" are intended to include the plural forms as well, unless the context clearly indicates otherwise.

The illustrations presented herein are not meant to be actual views of any particular component, structure, device, or system, but are merely idealized representations that are employed to describe embodiments of the present disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated but may include deviations in shapes that result, for example, from manufacturing techniques. For example, a region illustrated or described as box-shaped may have rough and/or nonlinear features. Moreover, sharp angles that are illustrated may be rounded. Thus, the materials, features, and regions illustrated in the figures are schematic in nature and their shapes are not intended to illustrate the precise shape of a material, feature, or region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not term a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, ion milling, abrasive planarization, or other known methods.

Reference will now be made to the drawings, where like numerals refer to like components throughout. The drawings are not necessarily drawn to scale.

A memory cell is disclosed. The memory cell includes a magnetic cell core that includes an attracter material proximate to at least one magnetic region (e.g., the free region, the fixed region) that is formed from a precursor magnetic material that comprises a diffusible species and at least one other species and that may be depleted to form a depleted magnetic material of the at least one magnetic region. The attracter material has a higher chemical affinity for the diffusible species, compared to a chemical affinity between the diffusible species and at least one other species of the precursor magnetic material. Therefore, the attracter material is formulated to attract and remove the diffusible species from the precursor magnetic material. The removal of the diffusible species may enable and improve crystallization of the depleted magnetic material, which crystallization, along with other configurations of the magnetic region, may enable formation of a magnetic region of a memory cell having high TMR (e.g., greater than 100%, e.g., greater than 200%) in addition to high MA strength.

In some embodiments, the attracter material may be amorphous and remain amorphous even during annealing, and crystallization, of the depleted magnetic material from which the diffusible species has been removed. Thus, the attracter material may be formulated and configured not to interfere with crystallization of the depleted magnetic material; again, enabling formation of the magnetic region in the memory cell with high TMR and high MA strength.

FIG. 1 illustrates an embodiment of a magnetic cell structure 100 according to the present disclosure. The magnetic cell structure 100 includes a magnetic cell core 101 over a substrate 102. The magnetic cell core 101 may be disposed between an upper electrode 104 above and a lower electrode 105 below. The magnetic cell core 101 includes a magnetic region and another magnetic region, for example, a "fixed region" 110 and a "free region" 120, respectively, with an oxide region (e.g., an "intermediate oxide region" 130) between. The intermediate oxide region 130 may be configured as a tunnel region and may contact the fixed region 110 along interface 131 and may contact the free region 120 along interface 132.

Either or both of the fixed region 110 and the free region 120 may be formed homogeneously or, optionally, may be formed to include more than one sub-region. For example, with reference to FIG. 1A, in some embodiments, a fixed region 110' of the magnetic cell core 101 (FIG. 1) may include multiple portions. For example, the fixed region 110' may include a magnetic sub-region as an oxide-adjacent portion 113. An intermediate portion 115, such as a conductive sub-region, may separate the oxide-adjacent portion 113 from an electrode-adjacent portion 117. The electrode-adjacent portion 117 may include an alternating structure of magnetic sub-regions 118 and coupler sub-regions 119.

One or more lower intermediary regions 140 may, optionally, be disposed under the magnetic regions (e.g., the fixed region 110 and the free region 120), and one or more upper intermediary regions 150 may, optionally, be disposed over the magnetic regions of the magnetic cell structure 100. The lower intermediary regions 140 and the upper intermediary regions 150, if included, may be configured to inhibit diffusion of species between the lower electrode 105 and overlying materials and between the upper electrode 104 and underlying materials, respectively, during operation of the memory cell.

The magnetic cell core 101 may include a foundation region 160 over the substrate 102. The foundation region 160 may provide a smooth template upon which overlying materials are formed. In some embodiments, the foundation region 160 may be formed directly on the lower electrode 105. In other embodiments, such as that illustrated in FIG. 1, the foundation region 160 may be formed on the one or more lower intermediary regions 140.

In some embodiments, as illustrated in FIG. 1, the magnetic cell core 101 may also include a secondary oxide region 170 formed proximate to the free region 120, e.g., adjacent to a surface of the free region 120 that is opposite a surface of the free region 120 proximate to the intermediate oxide region 130. Thus, the secondary oxide region 170 may be spaced from the intermediate oxide region 130 by the free region 120. The secondary oxide region 170 may, thus, be disposed to induce magnetic anisotropy ("MA") along a surface of the free region 120 that is proximate to the secondary oxide region 170.

In some embodiments, such as that illustrated in FIG. 1, the secondary oxide region 170 may be formed over (e.g., directly on) the foundation region 160, such that an upper surface of the foundation region 160 and a lower surface of the secondary oxide region 170 may contact one another. In some embodiments, the foundation region 160 is formulated and configured to enable formation of the secondary oxide region 170 to have a crystal structure that enables formation of the free region 120, over the secondary oxide region 170, with a desired crystal structure (e.g., a bcc (001) crystalline structure).

The free region 120 is formed proximate to (e.g., over) the secondary oxide region 170, and an attracter region 180 may be formed proximate to the free region 120. In some embodiments, the attracter region 180 may be between the secondary oxide region 170 and the free region 120.

As discussed in more detail below, material of the attracter region 180 may be formulated to have a higher chemical affinity for a diffusible species from a neighboring precursor magnetic material than the chemical affinity between other species of the neighboring precursor magnetic material and the diffusible species. The initial presence of the diffusible species in the precursor magnetic material may inhibit crystallization of the precursor magnetic material, but the proximity of the attracter region 180 to the precursor magnetic material may enable transference of the diffusible species from the precursor magnetic material to material of the attracter region 180, leaving a depleted magnetic material (i.e., a magnetic material with a lower concentration of the diffusible species compared to a concentration before transference) that is enabled to crystalize into a desired crystalline structure (e.g., a bcc (001)). The desired crystalline structure may be propagated from another neighboring material, e.g., the oxide of the intermediate oxide region 130 or the secondary oxide region 170. In some embodiments, the attracter region 180 may be formulated to be amorphous and remain amorphous even while the neighboring depleted magnetic material crystallizes. Thus, the material of the attracter region 180 may not inhibit the crystallization of the neighboring depleted magnetic material. Moreover, the attracter region 180, even if disposed between an oxide region (e.g., the intermediate oxide region 130) and a magnetic region (e.g., the free region 120), may not substantially degrade the MA-inducement between the oxide region and the magnetic region. Accordingly, a magnetic region may be crystallized in a structure that promotes high TMR while an adjacent oxide region promotes high MA strength.

The attracter region 180 may be thin (e.g., less than about 6 Å (less than about 0.6 nm) in thickness (e.g., between about 3 Å (about 0.3 nm) and about 5 Å (about 0.5 nm) in height)). The thickness of the attracter region 180 may be selected to provide attracter material in the attracter region 180 having a desired capacity to receive the diffusible species from neighboring precursor magnetic material while still enabling MA-inducement between a neighboring oxide region (e.g., the intermediate oxide region 130) and the neighboring magnetic region (e.g., the free region 120). A thicker attracter region 180 may have a relatively higher capacity for the diffusible species, compared to a thinner attracter region 180, while a thinner attracter region 180 may accommodate relatively greater MA-inducement, compared to a thicker attracter region 180. Therefore, the thickness of the attracter region 180 may be tailored to desired attraction and MA-inducement. The attracter material in the attracter region 180 may function as a seed for formation of the magnetic material (e.g., the precursor magnetic material).

Figure 1A:
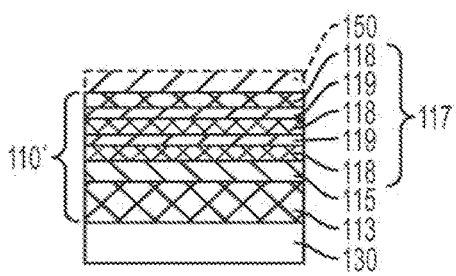
FIG. 1A is an enlarged view of box 1AB of FIG. 1, according to an alternate embodiment of the present disclosure, wherein the fixed region includes an oxide-adjacent portion, an intermediate portion, and an electrode-adjacent portion.
Figure 1B:
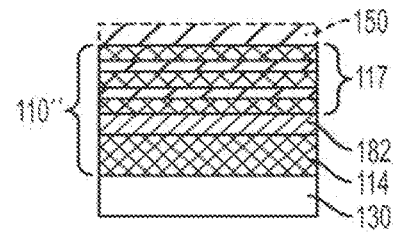
FIG. 1B is an enlarged view of box 1AB of FIG. 1, according to another alternate embodiment of the present disclosure, wherein the fixed region includes an oxide-adjacent portion, an intermediate attracter portion, and an electrode-adjacent portion.

With reference to FIG. 1B, in some embodiments, additional attracter regions may be present. For example, another attracter region 182 may be included in the magnetic cell core 101 (FIG. 1). The another attracter region 182 may be proximate to magnetic material (e.g., the precursor magnetic material, initially, and, subsequently, the depleted magnetic material) of a fixed region 110". In some embodiments, the another attracter region 182 may form an intermediate portion of the fixed region 110", between an oxide-adjacent portion 114 and the electrode-adjacent portion 117. The another attracter region 182 may, therefore, be formulated and disposed so as to attract a diffusible species from a neighboring precursor magnetic material (e.g., of the oxide-adjacent portion 114), to promote crystallization of the depleted magnetic material into a desired crystalline structure. The another attracter region 182 may also be formulated to be amorphous and remain amorphous as the neighboring depleted magnetic material crystallizes, so as to not interfere with the crystallization.

Figure 1C:
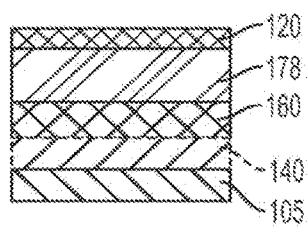
FIG. 1C is an enlarged view of box 1CD of FIG. 1, according to an alternate embodiment of the present disclosure, wherein an attracter region and a secondary oxide region are integrated with one another.

In some embodiments, the attracter region 180 (FIG. 1) and the secondary oxide region 170 (FIG. 1) may be integrated with one another as an attracter oxide region 178, as illustrated in FIG. 1C. For example, the attracter material may be a sub-region on or in the secondary oxide region 170 (FIG. 1) or, alternatively, the attracter material may be intermixed with the secondary oxide region 170 (FIG. 1) to form the attracter oxide region 178. Accordingly, in some embodiments, a surface of the free region 120 may interface not only with the oxide material, but also with the attracter material. Nonetheless, a surface of the free region 120 may neighbor the oxide material (e.g., of the secondary oxide region 170 (FIG. 1) or the attracter oxide region 178 (FIG. 1C)) with the attracter material (e.g., of the attracter region 180 (FIG. 1) or the attracter oxide region 178 (FIG. 1C)) in proximity therewith.

With continued reference to FIG. 1, in embodiments in which the attracter region 180 is proximate to the free region 120, the attracter region 180 may be physically isolated from the fixed region 110 by one or more regions, e.g., by the free region 120 and the intermediate oxide region 130. Therefore, components of the attracter region 180 may not chemically react with the fixed region 110.

In embodiments such as that of FIG. 1B, the another attracter region 182, proximate to the fixed region 110" may be physically isolated from the free region 120 by one or more regions, e.g., by the oxide-adjacent portion 114 of the fixed region 110" and the intermediate oxide region 130. Therefore, components of the another attracter region 182 may not chemically react with the free region 120.

Figure 1D:
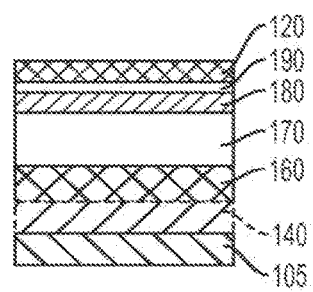
FIG. 1D is an enlarged view of box 1CD of FIG. 1, according to another alternate embodiment of the present disclosure, wherein an attracter region is spaced from a magnetic region by an intermediate region.

With respect to FIG. 1D, in some embodiments, the attracter region 180 may be spaced from a neighboring magnetic region (e.g., the free region 120) by one or more intermediate regions 190. Such intermediate regions 190 may be formulated and configured to allow diffusion of the diffusible species from the magnetic region (e.g., the free region 120) to the attracter region 180.

Accordingly, the magnetic cell structure 100 of FIG. 1 is configured as a "top-pinned" memory cell, i.e., a memory cell in which the fixed region 110 is disposed over the free region 120. The magnetic cell structure 100 also includes dual oxide regions, i.e., the intermediate oxide region 130 and the secondary oxide region 170. Both of the intermediate oxide region 130 and the secondary oxide region 170 may be configured to induce MA in the free region 120, even with the attracter region 180 disposed between the secondary oxide region 170 and the free region 120.

Alternatively, as illustrated in FIG. 2, a magnetic cell structure 200, according to an embodiment of the present disclosure, may be configured as a top-pinned memory cell with a single MA-inducing oxide region (e.g., the intermediate oxide region 130). A magnetic cell core 201 may, therefore, include an attracter region 280 over the lower electrode 105 and, if present, the lower intermediary regions 140, without an adjacent oxide region (i.e., without the secondary oxide region 170 (FIG. 1)). In such embodiments, the attracter region 280 may be formed to a greater thickness than the thickness of the attracter region 180 of the dual-oxide configuration (see FIG. 1) because, for example, the attracter region 280 need not enable MA-inducement between a neighboring magnetic region (e.g., the free region 120) and neighboring oxide region. For example, and without limitation, the attracter region 280 may be between about 10 Å (about 1.0 nm) to about 100 Å (about 10.0 nm) in thickness. The thickness of the attracter region 280 may be selected to provide a desired capacity for removing the diffusible species from neighboring precursor magnetic material (e.g., in the free region 120).

In the top-pinned, single oxide region configuration of FIG. 2, the fixed region 110 may be alternatively configured as either the fixed region 110' of FIG. 1A or the fixed region 110" of FIG. 1B, as discussed above. Thus, as with the fixed region 110" of FIG. 1B, the magnetic cell structure 200 may include more than one attracter region (e.g., the attracter region 280 (FIG. 2) and the another attracter region 182 (FIG. 1B)). In these or other embodiments, the attracter region 280 may be separated from its neighboring magnetic region (e.g., the free region 120) by one or more regions or sub-regions (e.g., as with the intermediate region 190 of FIG. 1D).

The memory cells of embodiments of the present disclosure may be configured as out-of-plane STT-MRAM cells, as in FIGS. 1 and 2, or as in-plane STT-MRAM cells, as illustrated in FIG. 3. "In-plane" STT-MRAM cells include magnetic regions exhibiting a magnetic orientation that is predominantly oriented in a horizontal direction, while "out-of-plane" STT-MRAM cells, include magnetic regions exhibiting a magnetic orientation that is predominantly oriented in a vertical direction. For example, as illustrated in FIG. 1, the STT-MRAM cell may be configured to exhibit a vertical magnetic orientation in at least one of the magnetic regions (e.g., the fixed region 110 and the free region 120). The vertical magnetic orientation exhibited may be characterized by perpendicular magnetic anisotropy ("PMA") strength. As illustrated in FIG. 1 by arrows 112 and double-pointed arrows 122, in some embodiments, each of the fixed region 110 and the free region 120 may exhibit a vertical magnetic orientation. The magnetic orientation of the fixed region 110 may remain directed in essentially the same direction throughout operation of the STT-MRAM cell, for example, in the direction indicated by arrows 112 of FIG. 1. The magnetic orientation of the free region 120, on the other hand, may be switched, during operation of the cell, between a parallel configuration and an anti-parallel configuration, as indicated by double-pointed arrows 122 of FIG. 1. As another example, as illustrated in FIG. 3, an in-plane STT-MRAM cell may be configured to exhibit a horizontal magnetic orientation in at least one of the magnetic regions (e.g., a fixed region 310 and a free region 320), as indicated by arrow 312 in the fixed region 310 and double-pointed arrow 322 in the free region 320. Though FIG. 3 illustrates only the fixed region 310, the intermediate oxide region 130, and the free region 320, overlying regions may be those overlying the fixed region 110 of FIGS. 1 and 2 and underlying regions may be those underlying the free region 120 in FIGS. 1 and 2.

Figure 5:
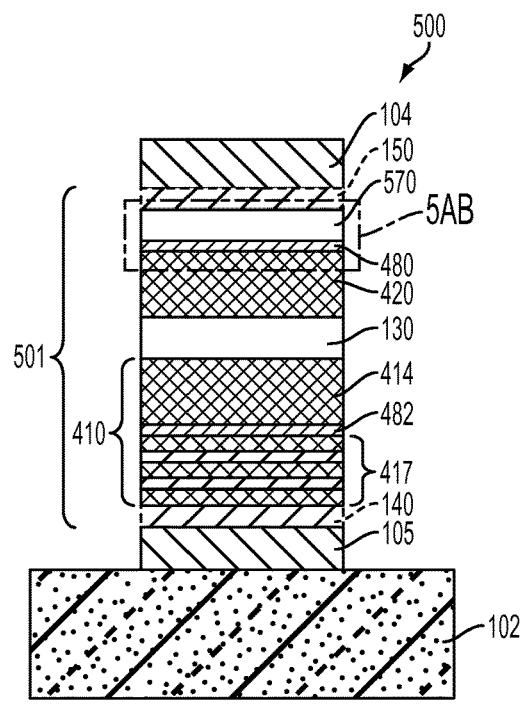
FIG. 5 is a cross-sectional, elevational, schematic illustration of a magnetic cell structure according to an embodiment of the present disclosure, wherein the magnetic cell structure includes a fixed region underlying a free region, dual oxide regions, an attracter region proximate to one of the dual oxide regions and also proximate to the free region, and another attracter region proximate to the fixed region.

Though in some embodiments, such as that of FIGS. 1 and 2, the fixed region 110 may overlay the free region 120, in other embodiments, such as that of FIGS. 4 and 5, the fixed region 110 may underlay the free region 120. For example, and without limitation, in FIG. 4, illustrated is a magnetic cell structure 400 having a magnetic cell core 401 in which a fixed region 410 overlays the lower electrode 105 and, if present, the lower intermediary regions 140. The foundation region 160 (not illustrated in FIG. 4) may, optionally, be included between, e.g., the lower electrode 105 (or the lower intermediary regions 140, if present) and the fixed region 410. The fixed region 410 may, for example and without limitation, be configured as a multi-sub-region fixed region 410, with an electrode-adjacent portion 417 that may be configured as an alternating structure as in the electrode-adjacent portion 114 of FIGS. 1A and 1B. An oxide-adjacent portion 414 of, e.g., a homogeneous magnetic material (e.g., a precursor magnetic material), may overlay the electrode-adjacent portion 417. An another attracter region 482 or, alternatively, a sub-region such as the intermediate portion 115 of FIG. 1A, may be disposed between the electrode-adjacent portion 417 and the oxide-adjacent portion 414. The intermediate oxide region 130 may overlay the fixed region 410, and a free region 420 may overlay the intermediate oxide region 130.

An attracter region 480 may be proximate to at least one of the fixed region 410 and the free region 420. For example, as illustrated in FIG. 4, the attracter region 480 may overlay the free region 420. In other embodiments (not illustrated in FIG. 4), the attracter region 480 or another attracter region may alternatively or additionally underlay the free region 420 or be disposed internal to the free region 420.

Regardless, the attracter region 480 is proximate to a precursor magnetic material (e.g., of the free region 420) and is formulated to attract a diffusible species from the precursor magnetic material to promote crystallization of the depleted magnetic material into a desired crystalline structure that enables high TMR.

The upper electrode 104 and, if present, the upper intermediary regions 150 may overlay the attracter region 480 and the free region 420. Thus, the magnetic cell structure 400 is configured as a "bottom-pinned" memory cell with a single MA-inducing oxide region (e.g., the intermediate oxide region 130).

With reference to FIG. 5, illustrated is a magnetic cell structure 500 also configured as a bottom-pinned memory cell. The illustrated magnetic cell structure 500 includes a magnetic cell core 501 having dual oxide regions, e.g., the intermediate oxide region 130 and a secondary oxide region 570 between the free region and, e.g., the attracter region 480, and the upper electrode 104. In some such embodiments, the attracter region 480 may be incorporated with the secondary oxide region 570, e.g., either as a sub-region of the secondary oxide region 570 or as an attracter oxide region, such as the attracter oxide region 178 of FIG. 1C. Accordingly, in any of the embodiments described herein, the relative dispositions of the fixed region 110, the intermediate oxide region 130, the free region 120, sub-regions thereof (if any), and attracter regions 180 (FIG. 1, FIG. 1D), 182 (FIG. 1B), 280 (FIG. 2), 480 (FIGS. 4 and 5), and the secondary oxide region 170 (FIG. 1), 570 (FIG. 5) or the attracter oxide region 178 (FIG. 1C) (if present) may be respectively reversed. Even if reversed, the intermediate oxide region 130 is disposed between the free region 120 (FIGS. 1, 2), 420 (FIGS. 4 and 5) and the fixed region 110 (FIGS. 1 and 2), 110' (FIG. 1A), 110'' (FIG. 1B), 410 (FIGS. 4 and 5) with at least one attracter region (e.g., the attracter region 180 (FIGS. 1 and 1D), the attracter oxide region 178 (FIG. 1C), the another attracter region 182 (FIG. 1B), the attracter region 280 (FIG. 2), the another attracter region 482 (FIGS. 4 and 5)) proximate to precursor magnetic material of at least one of the magnetic regions (e.g., at least one of the free region 120 (FIGS. 1, 2), 420 (FIGS. 4 and 5) and the fixed region 110 (FIGS. 1 and 2), 110' (FIG. 1A), 110'' (FIG. 1B), 410 (FIGS. 4 and 5)).

Figure 5A:
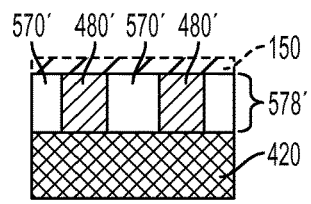
FIG. 5A is an enlarged view of box 5AB of FIG. 5, according to an alternate embodiment of the present disclosure, wherein an attracter oxide region includes a discontinuous secondary oxide region integrated with attracter sub-regions.
Figure 5B:
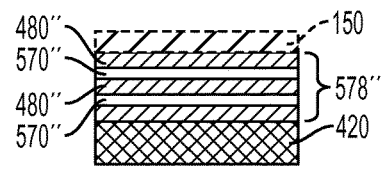
FIG. 5B is an enlarged view of box 5AB of FIG. 5, according to another alternate embodiment of the present disclosure, wherein an attracter oxide region includes attracter sub-regions alternating with secondary oxide sub-regions.

The attracter region (e.g., the attracter region 180 (FIG. 1)) may be continuous (i.e., without gaps in the attracter material of the region). In other embodiments, however, as illustrated in FIGS. 5A and 5B, an attracter region (e.g., the attracter region 180 (FIG. 1), the another attracter region 182 (FIG. 1B), the attracter region 280 (FIG. 2), the attracter region 480 (FIG. 4), the another attracter region 482 (FIG. 4)) may be discontinuous (i.e., may have gaps between the attracter material of the region). For example, as illustrated in FIG. 5A, a discontinuous attracter region 480' may be inter-disposed with a discontinuous secondary oxide region 570', forming an attracter oxide region 578'. As an alternative example, as illustrated in FIG. 5B, an attracter oxide region 578'' may be configured with a structure of alternating attracter sub-regions 480'' and secondary oxide sub-regions 570''.

Figure 6:
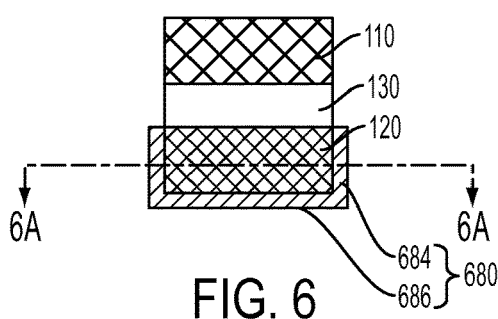
FIG. 6 is a cross-sectional, elevational, schematic illustration of a section of a magnetic cell structure according to an embodiment of the present disclosure, wherein an attracter region is laterally and vertically adjacent to a free region.
Figure 6A:
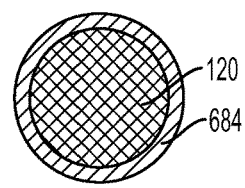
FIG. 6A is a cross-sectional, top plan, schematic illustration of the section of the magnetic cell structure of FIG. 6, taken along section line 6A-6A of FIG. 6.

In other embodiments, such as that of FIGS. 6 and 6A, an attracter region 680 may include a portion 684 that is laterally-adjacent to a magnetic region (e.g., the free region 120). The laterally-adjacent portion 684 may be in addition to, or an alternative to, a vertically-adjacent portion 686.

Accordingly, disclosed is a memory cell comprising a magnetic cell core. The magnetic cell core comprises a magnetic region comprising a depleted magnetic material formed from a precursor magnetic material comprising a diffusible species and at least one other species. The depleted magnetic material comprises the at least one other species. The magnetic cell core also comprises another magnetic region and an intermediate oxide region between the magnetic region and the another magnetic region. An amorphous region is proximate to the magnetic region. The amorphous region comprises an attracter material that has a chemical affinity for the diffusible species that is higher than a chemical affinity of the at least one other species for the diffusible species. The amorphous region comprises both the attracter material and at least a portion of the diffusible species from the precursor magnetic material.

Figure 9:
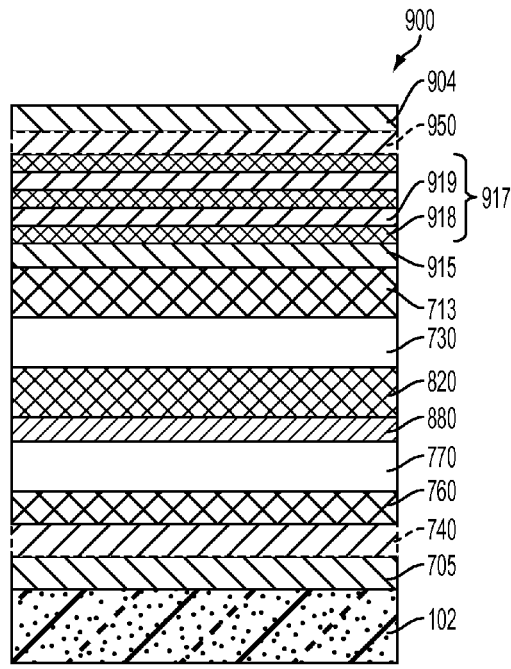

With reference to FIGS. 7 through 9, illustrated are stages in a method of fabricating magnetic cell structures, such as the magnetic cell structure 100 of FIG. 1. As illustrated in FIG. 7, a structure 700 may be formed with a conductive material 705 formed over the substrate 102, a foundation material 760 over the conductive material 705, an oxide material 770 over the foundation material 760, a precursor magnetic material 720 over the oxide material 770, another oxide material 730 over the precursor magnetic material 720, and another magnetic material 713 (which may also be characterized as "another precursor magnetic material 713") over the another oxide material 730. Optionally, a lower intermediary material 740 may be formed over the conductive material 705, before forming the foundation material 760 thereover, attracter material 780 is formed proximate to at least one of the precursor magnetic material 720 and the another precursor magnetic material 713. For example, according to the embodiment illustrated in FIG. 7, the attracter material 780 may be formed over (e.g., sputtered on) the oxide material 770, before forming the precursor magnetic material 720 thereover.

The conductive material 705, from which the lower electrode 105 (FIGS. 1, 1C, 1D, 2, 4, and 5) is formed, may comprise, consist essentially of, or consist of, for example and without limitation, a metal (e.g., copper, tungsten, titanium, tantalum), a metal alloy, or a combination thereof.

In embodiments in which the optional lower intermediary region 140 (FIGS. 1, 1C, 1D, 2, 4, and 5) is formed over the lower electrode 105, the lower intermediary material 740, from which the lower intermediary region 140 is formed, may comprise, consist essentially of, or consist of, for example and without limitation, tantalum (Ta), titanium (Ti), tantalum nitride (TaN), titanium nitride (TiN), ruthenium (Ru), tungsten (W), or a combination thereof. In some embodiments, the lower intermediary material 740, if included, may be incorporated with the conductive material 705 from which the lower electrode 105 (FIGS. 1, 1C, 1D, 2, 4, and 5) is to be formed. For example, the lower intermediary material 740 may be an upper-most sub-region of the conductive material 705.

The foundation material 760 may comprise, consist essentially of, or consist of, for example and without limitation, a material comprising at least one of cobalt (Co) and iron (Fe) (e.g., a CoFeB material), a material comprising a nonmagnetic material (e.g., a nonmagnetic conductive material (e.g., a nickel-based material)), or a combination thereof. The foundation material 760 may be formulated and configured to provide a template that enables forming a material (e.g., the oxide material 770) thereover at a desired crystalline structure (e.g., a bcc (001) crystalline structure).

The oxide material 770, from which the secondary oxide region 170 (FIGS. 1 and 1D) is formed, may comprise, consist essentially of, or consist of, for example and without limitation, a nonmagnetic oxide material (e.g., magnesium oxide (MgO), aluminum oxide ($Al_2O_3$), titanium oxide ($TiO_2$), or other oxide materials of conventional MTJ regions). The oxide material 770 may be formed (e.g., grown, deposited) directly on the foundation material 760. In embodiments in which the foundation material 760 is amorphous when initially formed, the resulting oxide material 770 may be crystalline (e.g., have a bcc (001) crystalline structure) when initially formed over the foundation material 760.

The precursor magnetic material 720, from which the free region 120 (FIG. 1) is eventually formed, may comprise, consist essentially of, or consist of, for example and without limitation, a ferromagnetic material including cobalt (Co) and iron (Fe) (e.g. $Co_xFe_y$, wherein x=10 to 80 and y=10 to 80) and, in some embodiments, also boron (B) (e.g., $Co_xFe_yB_z$, wherein x=10 to 80, y=10 to 80, and z=0 to 50). Thus, the precursor magnetic material 720 may comprise at least one of Co, Fe, and B (e.g., a CoFeB material, a FeB material, a CoB material). In other embodiments, the precursor magnetic material 720 may alternatively or additionally include nickel (Ni) (e.g., an NiB material). In some embodiments, the precursor magnetic material 720 may comprise the same material as the foundation material 760 or a material having the same elements as the foundation material 760, though with different atomic ratios of those elements. The precursor magnetic material 720 may be formed as a homogeneous region. In other embodiments, the precursor magnetic material 720 may include one or more sub-regions, e.g., of CoFeB material, with the sub-regions having different relative atomic ratios of Co, Fe, and B.

The precursor magnetic material 720 includes at least one diffusible species and at least one other species. The presence of the diffusible species is not necessary for the precursor magnetic material 720, or a depleted magnetic material formed therefrom, to exhibit magnetism. Moreover, the presence of the diffusible species in the precursor magnetic material 720 may inhibit crystallization of the precursor magnetic material 720. For example, in embodiments in which the precursor magnetic material 720 is a CoFeB material, the boron (B) may be the diffusible species. The presence of boron in the precursor magnetic material 720 may inhibit the precursor magnetic material 720 from being crystallized (e.g., during a subsequent anneal) to a desired crystalline structure (e.g., a bcc (001) crystalline structure).

The attracter material 780, which, in some embodiments, may be or include a conductive material (e.g., a metal), e.g., a conductive alloy (e.g., a metal alloy), may be formulated to have a higher chemical affinity for the diffusible species of the precursor magnetic material 720 than the chemical affinity of the other species of the precursor magnetic material 720 for the diffusible species. The conductive material of the attracter material 780 may absorb the diffusible species of the precursor magnetic material 720.

The attracter material 780 may also be formulated to be amorphous when initially formed on the oxide material 770 and to remain amorphous while a depleted magnetic material, formed from the precursor magnetic material 720, is crystallized. The depleted magnetic material may crystallize during an anneal stage during which a crystal structure propagates to the magnetic material (e.g., the precursor magnetic material 720, or the depleted magnetic material) from a neighboring crystalline material (e.g., the another oxide material 730). The amorphous state of the attracter material 780 may enable the crystallization of the depleted magnetic material without interference from the attracter material 780.

For example, and without limitation, in embodiments in which the precursor magnetic material 720 is a CoFeB material, the attracter material 780 may comprise, consist essentially of, or consist of an alloy of a transition metal, selected from the group consisting of iron (Fe), cobalt (Co), and nickel (Ni), and another transition metal (e.g., tungsten (W), hafnium (Hf), molybdenum (Mo), and zirconium (Zr)). The transition metal may have chemical affinity for boron. For example, and without limitation, the attracter material 780 may comprise, consist essentially of, or consist of tungsten (W) alloyed with at least one of iron (Fe), cobalt (Co), and nickel (Ni) (e.g., an iron-cobalt-tungsten (FeCoW)

alloy); an iron-cobalt (FeCo) alloy of the another transition metal; or hafnium (Hf) alloyed with at least one of iron (Fe), cobalt (Co), and nickel (Ni) (e.g., an iron-hafnium (FeHf) alloy), Such attracter material 780 may have a higher chemical affinity for the boron in the CoFeB precursor magnetic material 720 compared to the chemical affinity between boron and the other species of the CoFeB precursor magnetic material 720 (i.e., cobalt and iron).

The atomic ratios of the elements of the attracter material 780 may be selected to enable the attracter material 780 to be amorphous and remain amorphous even at high anneal temperatures (e.g., greater than about 500° C.) that are sufficient to crystallize the depleted magnetic material (at least after the diffusible species has been removed, at least in part, from the precursor magnetic material 720). For example, in embodiments in which the attracter material 780 is a FeCoW alloy, the FeCoW alloy may comprise greater than about 17 at. % tungsten (W), at which composition, the FeCoW may be amorphous up to temperatures of about 700° C. Moreover, the attracter material 780 may be formulated such that the attracter material 780 is stable (e.g., species will not out-diffuse) at high temperatures used during anneal for crystallizing the depleted magnetic material. Therefore, the high temperatures that promote crystallization of the depleted magnetic material, derived from the precursor magnetic material 720, to a desired crystalline structure (e.g., a bcc (001) structure) may be utilized without the attracter material 780 inhibiting the crystallization. Without being limited to any one theory, it is contemplated that the amorphous nature of the attracter material 780 avoids microstructure defects in the depleted magnetic material that may otherwise form if the attracter material 780 had a microstructure that differed from that of the desired crystalline structure (e.g., the bcc (001) structure) of the depleted magnetic material.

Further, because the attracter material 780 has a higher chemical affinity for the diffusible species compared to the other species of the precursor magnetic material 720, the proximity of the attracter material 780 to the precursor magnetic material 720 may enable removal of the diffusible species from the precursor magnetic material 720, which removal forms a depleted magnetic material 820 and an enriched attracter material 880, as illustrated in FIG. 8. For example, and with reference to FIGS. 8A and 8B, a diffusible species 721 may diffuse into the attracter material 780 and may chemically bond to the attracter material 780. This removal of the diffusible species 721 from the precursor magnetic material 720 by the attracter material 780 may occur during an anneal of the structure 700 (FIG. 7) to form an annealed structure 800, as illustrated in FIG. 8. In the annealed structure 800, the depleted magnetic material 820 has a lower concentration of the diffusible species 721 (FIGS. 8A and 8B), while the enriched attracter material 880 includes the diffused species 721, as illustrated in FIG. 8B. As used herein, the term "depleted," when used to describe a material, describes a material resulting from removal, in whole or part, of a diffusible species from a precursor material. As used herein, the term "enriched material," when used to describe a material, describes a material to which the diffusible species has been added (e.g., transferred). The magnetic cell structures 100 (FIG. 1), 200 (FIG. 2), 400 (FIG. 4), and 500 (FIG. 5) may thus include depleted magnetic material (e.g., in the free region 120 (FIGS. 1, 1C, 1D, 2, and 6), 320 (FIG. 3), 420 (FIGS. 4, 5, 5A, and 5B); in the oxide-adjacent portion 114 of the fixed region 110" (FIG. 1B); and in the oxide-adjacent portion 414 of the fixed region 410 (FIGS. 4 and 5)) and the diffusible-species-including enriched material (e.g., in the attracter region 180 (FIGS. 1 and 1D), 680 (FIG. 6); in the another attracter region 182 (FIG. 1B), 482 (FIGS. 4 and 5); in the attracter oxide region 178 (FIG. 1C); in the attracter region 280 (FIG. 2); in the attracter oxide region 578' (FIG. 5A); and in the attracter oxide region 578" (FIG. 5B)).

For example, and without limitation, in embodiments in which the precursor magnetic material 720 (FIG. 7) is a CoFeB material, the depleted magnetic material 820 may be a CoFe material (i.e., a magnetic material comprising cobalt and iron). In such embodiments in which the attracter material 780 (FIG. 7) is an iron-cobalt-tungsten (FeCoW) alloy or an iron-hafnium (FeHf) alloy, the enriched attracter material 880 may be a mixture of FeCoW or FeHf, respectively, and boron (B).

Without being restricted to any one theory, it is contemplated that removing the diffusible species of boron from the CoFeB precursor magnetic material 720 with an amorphous attracter material 780 may enable crystallization of the depleted magnetic material 820 at a lower anneal temperature than the crystallization temperature of the precursor magnetic material 720 (FIG. 7). Thus, an anneal temperature used (e.g., greater than about 500° C.) may ensure crystallization of the depleted magnetic material 820 without being so high as to degrade neighboring materials (e.g., without out-diffusing tungsten (W) from a FeCoW alloy enriched attracter material 880). The depleted magnetic material 820 may, therefore, be crystallized into a desired crystalline structure (e.g., a bcc (001) crystalline structure) that enables formation of a magnetic region (e.g., the free region 120 (FIGS. 1, 1C, 1D, 2, and 6), 320 (FIG. 3), 420 (FIGS. 4, 5, 5A, and 5B); the oxide-adjacent portion 114 of the fixed region 110" (FIG. 1B); the oxide-adjacent portion 414 of the fixed region 410 (FIGS. 4 and 5)) to a desired thickness without suffering from substantial structural defects, and the absence of substantial structural defects may enable a high TMR. In embodiments in which the free region 120 (FIGS. 1, 1C, 1D, 2, and 6), 320 (FIG. 3), 420 (FIGS. 4, 5, 5A, and 5B) is disposed between dual oxide regions (e.g., the intermediate oxide region 130 and the secondary oxide region 170 (FIG. 1)), high MA strength may also be enabled.

Without being limited to any one theory, it is further contemplated that removal of the diffusible species from the precursor magnetic material 720 (and/or from the another precursor magnetic material 713) may also promote inducement of MA along an interface between the depleted magnetic material 820 and a neighboring oxide material (e.g., the oxide material 770) in that the other species of the depleted magnetic material 820 may have more interaction with the oxide material 770 than the species would have if the diffusible species 721 were still incorporated in the precursor magnetic material 720. Therefore, even in embodiments in which only a single MA-inducing oxide region (e.g., the intermediate oxide region 130) is included, the MA strength may be greater, due to the presence of the attracter material 780 (or, rather, the enriched attracter material 880) than the MA strength of the same structure without the attracter material 780 (or, rather, the enriched attracter material 880).

While the free region 120 (FIG. 1) is discussed as being "formed from" the precursor magnetic material 720 (e.g., a CoFeB material) that comprises the diffusible species 721, the free region 120 of the fabricated, magnetic cell core 101 (FIG. 1) (or any cell core of the present disclosure) may comprise substantially less of the diffusible species 721 (e.g., the boron (B)) than when initially formed. Likewise, in embodiments in which magnetic material of the fixed region 110 (FIG. 1) is affected by a neighboring region of an attracter material, the fixed region 110 may comprise substantially less of the diffusible species 721 than it would without the nearby attracter material. Rather, the attracter region 180 (FIG. 1) of the fabricated, magnetic cell core 101 may comprise both the attracter material 780 and the diffusible species 721 (e.g., the boron (B)) that has diffused from the precursor magnetic material 720. Thus, unless the context indicates otherwise, as used herein, when describing a region "formed from" a material, the "material" means and includes the substance of the region prior to a transformative act (e.g., diffusion) during fabrication.

In some embodiments, the attracter material 780 may also be formulated such that an oxide thereof effects an inducement of MA with the free region 120 (FIG. 1). That is, while the diffusible species 721 from the precursor magnetic material 720 may react with (e.g., chemically bond to) the attracter material 780, a species from the attracter material 780 may also react with (e.g., chemically bond to) oxygen from the oxide material 770. In embodiments in which the attracter material 780 is formulated such that an oxide thereof induces MA with the free region 120 (FIG. 1), the oxide of the attracter material 780 may enhance the MA induced between the secondary oxide region 170 and the free region 120, rather than degrade the MA inducement.

With continued reference to FIGS. 7 and 8, the another oxide material 730, from which the intermediate oxide region 130 (FIG. 1) is formed, may be formed on the precursor magnetic material 720, e.g., before the anneal to crystallize the depleted magnetic material 820. The another oxide material 730 may comprise, consist essentially of, or consist of, for example and without limitation, a nonmagnetic oxide material (e.g., magnesium oxide (MgO), aluminum oxide ($Al_2O_3$), titanium oxide ($TiO_2$), or other oxide materials of conventional MTJ regions). The another oxide material 730 may be the same material as the oxide material 770 or a material comprising the same elements as the oxide material 770 though with different atomic ratios thereof. For example, and without limitation, both of the another oxide material 730 and the oxide material 770 may comprise MgO. The another oxide material 730 may be formed (e.g., grown, deposited) directly on the precursor magnetic material 720. The another oxide material 730 may be crystalline (e.g., with the bcc (001) structure) when initially formed and may be positioned such that, during anneal, the desired crystalline structure may propagate to a neighboring magnetic material to enable the depleted magnetic material 820 to crystallize into the same crystalline structure (e.g., the bcc (001) structure).

Other materials of the annealed structure 800 may also be crystallized due to annealing. The annealing process may be conducted at an annealing temperature of from about 300° C. to about 700° C. (e.g., about 500° C.) and may be held at the annealing temperature for from about one minute (about 1 min.) to about one hour (about 1 hr.). The annealing temperature and time may be tailored based on the materials of the structure 700, the desired crystal structure of, e.g., the depleted magnetic material 820, and a desired amount of depletion of the diffusible species 721 from the precursor magnetic material 720.

In some embodiments, such as that illustrated in FIGS. 7 and 8, the another precursor magnetic material 713, from which the oxide-adjacent portion 113 of the fixed region 110' (FIG. 1A) is formed, may be formed (e.g., grown, deposited) directly on the another oxide material 730, e.g., before or after the anneal stage that crystallizes the depleted magnetic material 820. The another precursor magnetic material 713 may comprise, consist essentially of, or consist of, for example and without limitation, ferromagnetic material including cobalt (Co) and iron (Fe) (e.g. $Co_xFe_y$, wherein x=10 to 80 and y=10 to 80) and, in some embodiments, also boron (B) (e.g., $Co_xFe_yB_z$, wherein x=10 to 80, y=10 to 80, and z=0 to 50). Thus, the another precursor magnetic material 713 may comprise a CoFeB material. In some embodiments, the another precursor magnetic material 713 may be the same material as either or both of precursor magnetic material 720 and foundation material 760 or a material having the same elements, though in different atomic ratios.

In some embodiments, such as an embodiment to fabricate the structure of FIG. 1B, the another precursor magnetic material 713 may include a diffusible species (e.g., boron (B)) that may be removed from the another precursor magnetic material 713 by another attracter material that may be formed on (e.g., over) the another precursor magnetic material 713 as an intermediate material 915, as illustrated in FIG. 9. In such embodiments, therefore, the intermediate material 915 may be formed on the another precursor magnetic material 713 prior to annealing to form the annealed structure 800, such that the annealed structure 800 may include a depleted magnetic material formed from the another precursor magnetic material 713 and an enriched attracter material proximate to the depleted magnetic material.

In embodiments in which the structure of FIG. 1A is to be formed, the intermediate material 915 may not be formulated or otherwise formed in a manner that configures the intermediate material 915 to be another attracter material. In such embodiments, the intermediate material 915 may be formed on the another precursor magnetic material 713 after the annealed structure 800 (FIG. 8) has been formed. The intermediate material 915 may, therefore, comprise, consist essentially of, or consist of a conductive material (e.g., tantalum (Ta)).

The remaining materials of the magnetic cell structure (e.g., the magnetic cell structure 100 (FIGS. 1, 1A, 1B) may be fabricated over the intermediate material 915 to form a precursor structure 900, as illustrated in FIG. 9. For example, material 917, such as alternating magnetic material 918 and coupler material 919, may be formed on the intermediate material 915. For example, and without limitation, the materials 917 may comprise, consist essentially of, or consist of cobalt/palladium (Co/Pd) multi-sub-regions; cobalt/platinum (Co/Pt) multi-sub-regions; cobalt/nickel (Co/Ni) multi-sub-regions; cobalt iron terbium (Co/Fe/Tb) based materials, $L_10$ materials, coupler materials, or other magnetic materials of conventional fixed regions. Thus, the 110' (FIG. 1A), 110" (FIG. 1B) may include the electrode-adjacent portion 117 formed from the materials 917, the intermediate portion 115 (FIG. 1A) or the another attracter region 182 (FIG. 1B) formed from the intermediate material 915, and the oxide-adjacent portion 113 (FIG. 1A) or 114 (FIG. 1B) formed from the another precursor magnetic material 713. In embodiments in which the intermediate material 915 is formulated as the another attracter material, the oxide-adjacent portion 114 (FIG. 1B) includes a depleted magnetic material resulting from the removal of a diffusible species from the another precursor magnetic material 713 by the another attracter material (i.e., the intermediate material 915).

In some embodiments, optionally, one or more upper intermediary materials 950 may be formed over the materials 917 for the electrode-adjacent portion 117 of the fixed region 110' (FIG. 1A), 110" (FIG. 1B). The upper intermediary materials 950, which, if included, form the optional upper intermediary regions 150 (FIG. 1), may comprise, consist essentially of, or consist of materials configured to ensure a desired crystal structure in neighboring materials. The upper intermediary materials 950 may alternatively or additionally include metal materials configured to aid in patterning processes during fabrication of the magnetic cell, barrier materials, or other materials of conventional STT-MRAM cell core structures. In some embodiments, the upper intermediary material 950 may include a conductive material (e.g., one or more materials such as copper, tantalum, titanium, tungsten, ruthenium, tantalum nitride, or titanium nitride) to be formed into a conductive capping region.

Another conductive material 904, from which the upper electrode 104 (FIG. 1) may be formed, may be formed over the materials 917 for the electrode-adjacent portion 117 of the fixed region 110' (FIG. 1A), 110" (FIG. 1B) and, if present, the upper intermediary materials 950. In some embodiments, the another conductive material 904 and the upper intermediary materials 950, if present, may be integrated with one another, e.g., with the upper intermediary materials 950 being lower sub-regions of the conductive material 904.

The precursor structure 900 may then be patterned, in one or more stages, to form the magnetic cell structure 100, according to the embodiment illustrated in FIGS. 1 and 1A. In embodiments in which the intermediate material 915 was formulated as another attracter material, such that annealing the another precursor magnetic material 713 and the intermediate material 915 may diffuse the diffusible species from the another precursor magnetic material 713 to the intermediate material 915 and promote crystallization of the another depleted magnetic material, patterning the precursor structure 900 may form the magnetic cell structure 100 of the embodiment illustrated in FIGS. 1 and 1B. Techniques for patterning structures such as the precursor structure 900 to form structures such as the magnetic cell structure 100 (FIGS. 1 and 1B) are known in the art and so are not described herein in detail.

After patterning, the magnetic cell structure 100 includes the magnetic cell core 101 including the attracter region 180 proximate to the free region 120 and, in the embodiment of FIG. 1B, the another attracter region 182 proximate to the fixed region 110". The free region 120, including the depleted magnetic material 820 (FIG. 8) and formed from the precursor magnetic material 720 (FIG. 7), comprises a lower concentration of the diffusible species 721 (FIG. 7) than a free region formed from the precursor magnetic material 720 (FIG. 7) without the attracter region 180 proximate thereto. Moreover, according to the embodiment of FIG. 1B, the fixed region 110", including depleted magnetic material in the oxide-adjacent portion 114 formed from the another precursor magnetic material 713 (FIG. 7), comprises a lower concentration of a diffusible species than a fixed region formed from the another precursor magnetic material 713 without the another attracter region 182 proximate thereto.

In some embodiments, the magnetic region (e.g., the free region 120, the fixed region 110" (FIG. 1B)) proximate to the attracter region (e.g., the attracter region 180, the another attracter region 182 (FIG. 1B)) may be completely depleted of the diffusible species. In other embodiments, the magnetic region may be partially depleted of the diffusible species. In such embodiments, the magnetic region may have a gradient of the diffusible species (e.g., boron) therethrough, with a low concentration of the diffusible species adjacent to the attracter region and a high concentration of the diffusible species opposite the attracter region. The concentration of the diffusible species may, in some embodiments, equilibrate after or during anneal.

The free region 120, or other magnetic region (e.g., the oxide-adjacent portion 114 of the fixed region 110" (FIG. 1B)), formed with a crystalline, depleted magnetic material 820 (FIG. 8), or other depleted magnetic material, may have a desired crystalline structure that may be substantially free of defects, due, at least in part, to the removal of the diffusible species and the amorphous microstructure of the attracter region 180 (or the another attracter region 182). It is contemplated that the attracter region 180 (or the another attracter region 182) may be amorphous even with the diffused species received therein.

The crystallinity of the free region 120 may effect a high TMR. Furthermore, the depleted magnetic material 820 of the free region 120 may promote MA-inducement with a neighboring oxide region (e.g., the secondary oxide region 170 and the intermediate oxide region 130). Moreover, in embodiments in which the free region 120 is disposed between dual oxide regions (e.g., the intermediate oxide region 130 and the secondary oxide region 170), high MA strength may be further promoted due to MA-inducement from both of the dual oxide regions. In such embodiments, MA may be induced along the surface of the free region 120 proximate to the secondary oxide region 170, even with the attracter region 180 disposed between the free region 120 and the secondary oxide region 170. The amount of attracter material 780 (FIG. 7) used to form the attracter region 180 may be tailored to be of an amount sufficient enough to effect removal of at least some of the diffusible species from the precursor magnetic material 720 (FIG. 7) while also being an amount not so substantial as to inhibit MA inducement between the secondary oxide region 170 and the free region 120.

In one embodiment, the magnetic cell structure 100 includes the lower electrode 105 formed from tantalum (Ta), the foundation region 160 formed from a CoFeB material to a thickness of about 6 Å (about 0.6 nm), the secondary oxide region 170 formed from MgO, the attracter region 180 formed from an FeCoW alloy comprising greater than about 17 at. % tungsten (W) to a height of about 3 Å (about 0.3 nm) to about 5 Å (about 0.5 nm), the free region 120 formed from a CoFeB precursor material to a thickness of about 14 Å (about 1.4 nm), the intermediate oxide region 130 formed from MgO, the oxide-adjacent portion 114 formed from a CoFeB precursor material to a thickness of about 13 Å (about 1.3 nm), the intermediate portion 115 formed from tantalum (Ta) to a thickness of about 3 Å (about 0.3 nm), and the electrode-adjacent portion 117 formed from alternating cobalt (Co) and palladium (Pd) or alternating cobalt (Co) and platinum (Pt) sub-regions. The attracter region 180 may be enriched with boron, the diffusible species of the CoFeB precursor material of the free region 120, and the free region 120 may be at least partially depleted of boron. Therefore, the free region 120 has a lower concentration of boron compared to the precursor magnetic material from which it was originally formed (i.e., the CoFeB precursor material) and may have a lower concentration of boron compared to that of the oxide-adjacent portion 114 of the fixed region 110' (FIG. 1A), the foundation region 160, or both. The free region 120 may have a bcc (001) crystalline structure, a high TMR (e.g., greater than about 1.00 (greater than about 100%), e.g., greater than about 2.0 (greater than about 200%)), and a high MA strength (e.g., at least about 1500 Oe (at least about 119 kA/m), e.g., greater than about 2000 Oe (about 160 kA/m), e.g., greater than about 2200 Oe (about 175 kA/m)).

Accordingly, disclosed is a method of forming a magnetic memory cell. The method comprises forming a structure. Forming the structure comprises forming a magnetic material over a substrate, forming an oxide material over the magnetic material, forming another magnetic material over the oxide material, and forming an amorphous attracter material proximate to at least one of the magnetic material and the another magnetic material. At least a portion of the structure is annealed to transfer a diffusible species from the at least one of the magnetic material and the another magnetic material to the amorphous attracter material, to convert the at least one of the magnetic material and the another magnetic material to a depleted magnetic material, and to crystalize the depleted magnetic material without crystallizing the amorphous attracter material. After annealing, a magnetic cell core structure is formed from the structure.

Figure 10A:
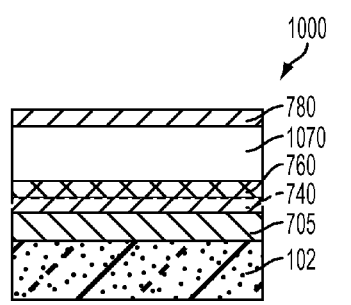

With reference to FIGS. 10A through 12B, illustrated are stages in an alternate method of forming a magnetic cell structure, such as the magnetic cell structure 100 of FIGS. 1 and 1C, according to an embodiment of the present disclosure. As illustrated in FIG. 10A, a structure 1000 may be formed to include, over the substrate 102, the conductive material 705, optionally the lower intermediary material 740, the foundation material 760, a precursor material 1070, and the attracter material 780. The precursor material 1070 may be a not-yet-oxidized metal material. For example, the precursor material 1070 may comprise, consist essentially of, or consist of magnesium (Mg), aluminum (Al), titanium (Ti), or another metal that, once oxidized, may be formulated to induce MA with the free region 120 (FIGS. 1 and 1C).

Figure 10B:
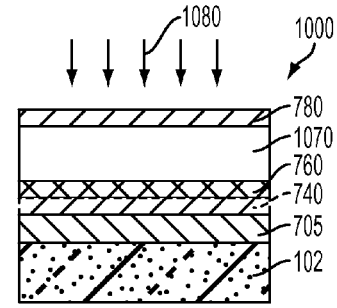
FIG. 10B is a cross-sectional, elevational, schematic illustration of the structure of FIG. 10A during an oxidizing stage of processing subsequent to that of FIG. 10A.
Figure 11:
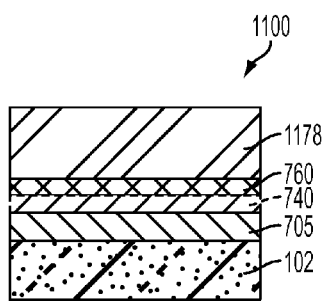

As illustrated in FIG. 10B, the structure 1000 may be exposed to an oxidizing environment, indicated by arrows 1080, to form structure 1100 of FIG. 11. Following the oxidation, the precursor material 1070 and the attracter material 780, in structure 1100 of FIG. 11, may be converted into an attracter oxide material 1178. Thus, as in FIG. 1C, the secondary oxide region 170 (FIG. 1) and the attracter region 180 (FIG. 1) may be integrated with one another as the attracter oxide region 178 (FIG. 1C) formed from the attracter oxide material 1178. Again, the attracter oxide material 1178 may be formulated to have a higher chemical affinity for the diffusible species of the precursor magnetic material 720 (FIG. 7) than a chemical affinity between the diffusible species and another species of the precursor magnetic material 720. The attracter oxide material 1178 may be amorphous and may remain amorphous even at anneal temperatures.

Figure 12A:
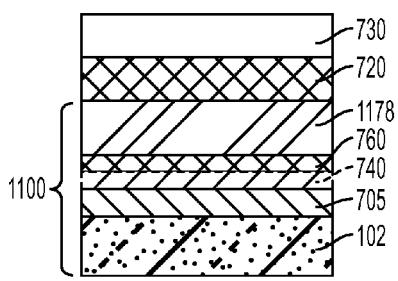
FIG. 12A is a cross-sectional, elevational, schematic illustration of a structure during a stage of processing subsequent to that of FIG. 11.
Figure 12B:
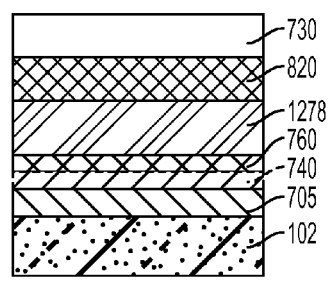

After forming the attracter oxide material 1178, the other lower-most materials of a magnetic cell structure to be formed may be formed over the attracter oxide material 1178. For example, as illustrated in FIG. 12A, the precursor magnetic material 720, the another oxide material 730, and, in some embodiments (not illustrated in FIG. 12A) the another precursor magnetic material 713 (see FIG. 7) may be formed, sequentially and from bottom to top, over the attracter oxide material 1178, and then annealed to form annealed structure 1200 of FIG. 12B, including the depleted magnetic material 820 and an enriched attracter oxide material 1278. Annealing may promote diffusion of the diffusible species from the precursor magnetic material 720 (FIG. 12A) to form the depleted magnetic material 820 and the enriched attracter oxide material 1278. The removal of the diffusible species from the precursor magnetic material 720 (FIG. 12A) and the amorphous nature of the attracter oxide material 1178 may enable crystallization of the depleted magnetic material 820 at a desired crystalline structure (e.g., a bcc (001) crystalline structure).

The upper-most materials of a precursor structure may then be formed. Such materials may include, for example, the another precursor magnetic material 713 (if not already present), the intermediate material 915, the materials 917, optionally the upper intermediary material 950, and the another conductive material 904. The precursor structure may then be patterned to form a magnetic cell structure such as the magnetic cell structure of FIGS. 1 and 1C. Such magnetic cell structure 100 includes the magnetic cell core 101 that includes the attracter oxide region 178 comprising the enriched attracter oxide material 1278 (FIG. 12B), formed from the attracter oxide material 1178 (FIG. 12A). The magnetic cell core 101 may, therefore, have a high TMR and high MA strength.

Figure 13:
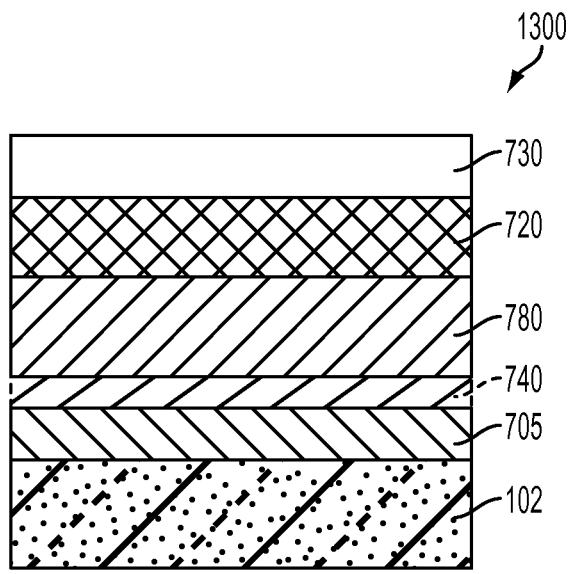
Figure 14:
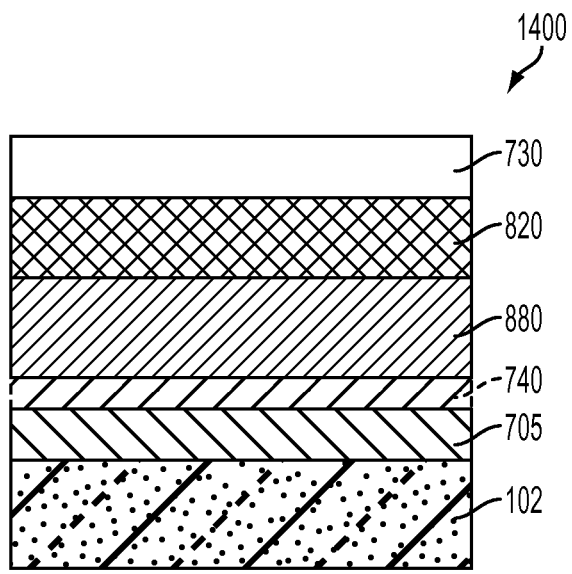

With reference to FIGS. 13 to 14, illustrated are stages in another alternate method of forming a magnetic cell structure, such as the magnetic cell structure 200 of FIG. 2, according to an embodiment of the present disclosure. As illustrated in FIG. 13, a structure 1300 may be formed to include, over the substrate 102 and from bottom to top, the conductive material 705, optionally the lower intermediary material 740, optionally the foundation material 760 (not illustrated in FIG. 13), the attracter material 780, the precursor magnetic material 720, and the another oxide material 730. In some embodiments, in which a fixed region 110' (FIG. 1A) or 110" (FIG. 1B) is to be formed in multiple portions, the another precursor magnetic material 713 (FIG. 7) may also be formed on the another oxide material 730.

The structure 1300 may be annealed to form an annealed structure 1400, as illustrated in FIG. 14, in which the attracter material 780 has been converted to an enriched attracter material 880 that comprises the diffused species derived from the precursor magnetic material 720, which has been converted to a depleted magnetic material 820. Thus, the depleted magnetic material 820 may be crystallized to a desired crystalline structure (e.g., the bcc (001) structure) to promote high TMR and high MA. The remaining materials of the magnetic cell structure 200 (FIG. 2) may be formed over the annealed structure, or over the structure 1300 before annealing, and then patterned by conventional techniques to form the magnetic cell structure 200 of FIG. 2.

According to one embodiment, the magnetic cell structure 200 (FIG. 2) includes the lower electrode 105 formed from tantalum (Ta), the attracter region 280 formed from an amorphous FeCoW alloy to a thickness of about 10 Å (about 1.0 nm) to about 100 Å (about 10.0 nm), the free region 120 formed from a CoFeB material to a thickness of about 12 Å (about 1.2 mu), the intermediate oxide region 130 formed from MgO, the oxide-adjacent portion 114 formed from a CoFeB precursor material to a thickness of about 13 Å (about 1.3 nm), the intermediate portion 115 formed from tantalum (Ta) to a thickness of about 3 Å (about 0.3 nm), and the electrode-adjacent portion 117 formed from alternating cobalt (Co) and palladium (Pd) or alternating cobalt (Co) and platinum (Pt) sub-regions. The attracter region 280 may be enriched with boron, the diffusible species of the CoFeB precursor material of the free region 120, and the free region 120 may be at least partially depleted of boron. Therefore, the free region 120 has a lower concentration of boron compared to the precursor magnetic material from which it was originally formed (i.e., the CoFeB precursor material) and may have a lower concentration of boron compared to that of the oxide-adjacent portion 114 of the fixed region

110' (FIG. 1A). The free region 120 may have a bcc (001) crystalline structure, a high TMR (e.g., greater than about 1.00 (greater than about 100%), e.g., greater than about 2.0 (greater than about 200%)), and a high MA strength (e.g., at least about 1500 Oe (at least about 119 kA/m), e.g., greater than about 2000 Oe (about 160 kA/m), e.g., greater than about 2200 Oe (about 175 kA/m)).

Figure 15:
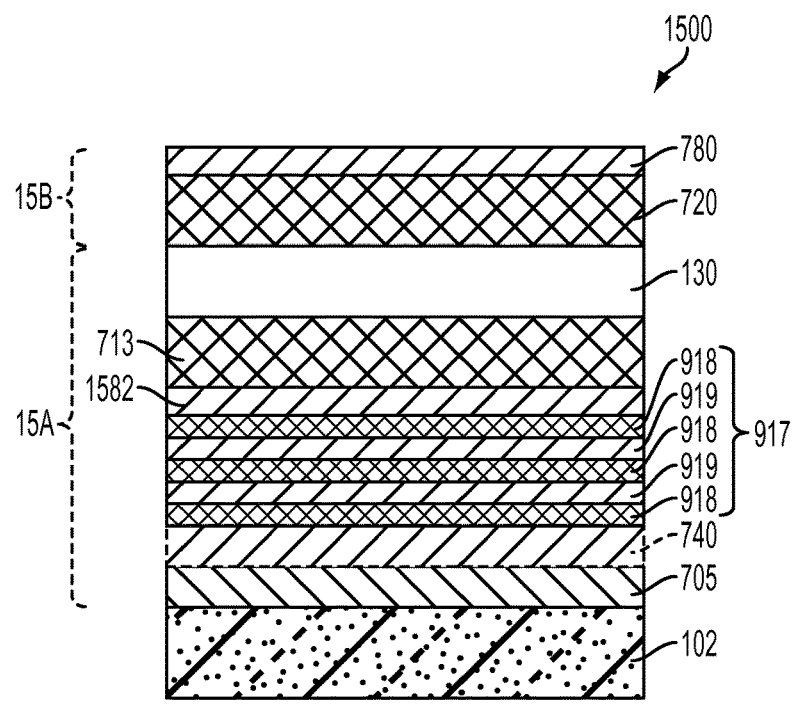
Figure 16:
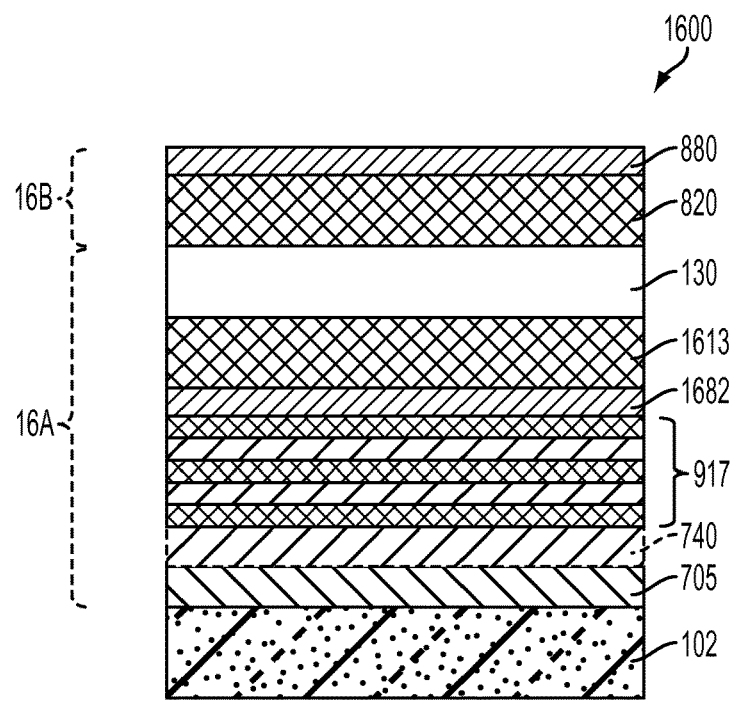

With reference to FIGS. 15 and 16, illustrated are stages in another method of forming a magnetic cell structure, such as the magnetic cell structure 400 of FIG. 4 or the magnetic cell structure 500 of FIG. 5, according to an embodiment of the present disclosure. As illustrated in FIG. 15, a structure 1500 may be formed to include, over the substrate 102 and from bottom to top, the conductive material 705, optionally the lower intermediary material 740, optionally the foundation material (not illustrated in FIG. 15), the materials 917 of alternating magnetic material 918 and coupler material 919, another attracter material 1582 (as the intermediate material 915 (FIG. 9)), the another precursor magnetic material 713, and the another oxide region 130, thus providing the materials of portion 15A over the substrate 102. In some embodiments, the precursor magnetic material 720 and the attracter material 780 may also be included in the structure 1500 such that portion 15B may be formed over the portion 15A before materials are annealed. The another attracter material 1582 may be the same material as any of the attracter materials discussed above. The another attracter material 1582 may have the same or a different composition as the attracter material 780.

The structure 1500, either with only portion 15A (before portion 15B has been formed) or with portion 15A and portion 15B, may be annealed to form annealed structure 1600 (either with only portion 16A or with both portion 16A and portion 16B). In embodiments in which portion 15A is annealed to form portion 16A without portion 15B/16B present, the materials of portion 15B may then be formed over portion 16A and annealed to form portion 16B over portion 16A. In the annealed structure 1600, the another attracter material 1582 converts to another enriched attracter material 1682, including a diffused species from the another precursor magnetic material 713, which is converted to another depleted magnetic material 1613. Additionally, the precursor magnetic material 720 converts to depleted magnetic material 820, with the diffused species transferred to the attracter material 780, which converts to enriched attracter material 880. Thus, both the depleted magnetic material 820 and the another depleted magnetic material 1613 may be crystallized to a desired crystalline structure (e.g., a bcc (001)) that promotes high TMR and high MA strength. The remaining materials of the magnetic cell structure 400 (FIG. 4) or FIG. 5) may be formed over the annealed structure, or over the structure 1500 before annealing, and then patterned to form the magnetic cell structure 400 of FIG. 4 or the magnetic cell structure 500 of FIG. 5.

According to one embodiment, the magnetic cell structure 400 (FIG. 4) includes the lower electrode 105 formed from tantalum (Ta), the electrode-adjacent portion 417 formed from alternating cobalt (Co) and palladium (Pd) or alternating cobalt (Co) and platinum (Pt) sub-regions, the another attracter region 482 formed of an amorphous FeCoW alloy to a thickness of about 3 Å (about 0.3 nm) to about 5 Å (about 0.5 nm), the oxide-adjacent portion 414 formed from a CoFeB precursor material to a thickness of about 13 Å (about 1.3 nm), the intermediate oxide region 130 formed from MgO, the free region 420 formed from a CoFeB precursor material to a thickness of about 14 Å (about 1.4 nm), and the attracter region 480 formed of an amorphous FeCoW alloy to a thickness of about 3 Å (about 0.3 nm) to about 5 Å (about 0.5 nm). Both the attracter region 480 and the another attracter region 482 may be enriched with boron, the diffusible species of the CoFeB precursor material of the free region 420 and the oxide-adjacent portion 414, respectively, which may each be at least partially depleted of boron. Therefore, the free region 420 and the oxide-adjacent portion 414 have a lower concentration of boron compared to the precursor magnetic materials from which they were originally formed (i.e., the CoFeB precursor material). The free region 420 and the oxide-adjacent portion 414 may have a bcc (001) crystalline structure, and the magnetic cell structure 400 may have a high TMR (e.g., greater than about 1.00 (greater than about 100%), e.g., greater than about 2.0 (greater than about 200%)), and a high MA strength (e.g., at least about 1500 Oe (at least about 119 kA/m), e.g., greater than about 2000 Oe (about 160 kA/m), e.g., greater than about 2200 Oe (about 175 kA/m)).

Further, according to one embodiment, in which the another oxide material 730 (FIG. 7) is formed on the structure 1500 (FIG. 15) or the annealed structure 1600 (FIG. 16) before patterning, the magnetic cell structure 500 (FIG. 5) includes the lower electrode 105 formed from tantalum (Ta), the electrode-adjacent portion 417 formed from alternating cobalt (Co) and palladium (Pd) or alternating cobalt (Co) and platinum (Pt) sub-regions, the another attracter region 482 formed of an amorphous FeCoW alloy to a thickness of about 3 Å (about 0.3 nm) to about 5 Å (about 0.5 nm), the oxide-adjacent portion 414 formed from a CoFeB precursor material to a thickness of about 13 Å (about 1.3 nm), the intermediate oxide region 130 formed from MgO, the free region 420 formed from a CoFeB precursor material to a thickness of about 14 Å (about 1.4 nm), the attracter region 480 formed of an amorphous FeCoW alloy to a thickness of about 3 Å (about 0.3 nm) to about 5 Å (about 0.5 nm), and the secondary oxide region 570 formed of MgO. As with the magnetic cell structure 400 of FIG. 4, both the attracter region 480 and the another attracter region 482 of the magnetic cell structure 500 of FIG. 5 may be enriched with boron, the diffusible species of the CoFeB precursor material of the free region 420 and the oxide-adjacent portion 414, respectively, which may each be at least partially depleted of boron. Therefore, the free region 420 and the oxide-adjacent portion 414 have a lower concentration of boron compared to the precursor magnetic materials from which they were originally formed (i.e., the CoFeB precursor material). The free region 420 and the oxide-adjacent portion 414 may have a bcc (001) crystalline structure, and the magnetic cell structure 400 may have a high TMR (e.g., greater than about 1.00 (greater than about 100%), e.g., greater than about 2.0 (greater than about 200%)), and a high MA strength (e.g., at least about 1500 Oe (at least about 119 kA/m), e.g., greater than about 2000 Oe (about 160 kA/m), e.g., greater than about 2200 Oe (about 175 kA/m)).

Figure 17:
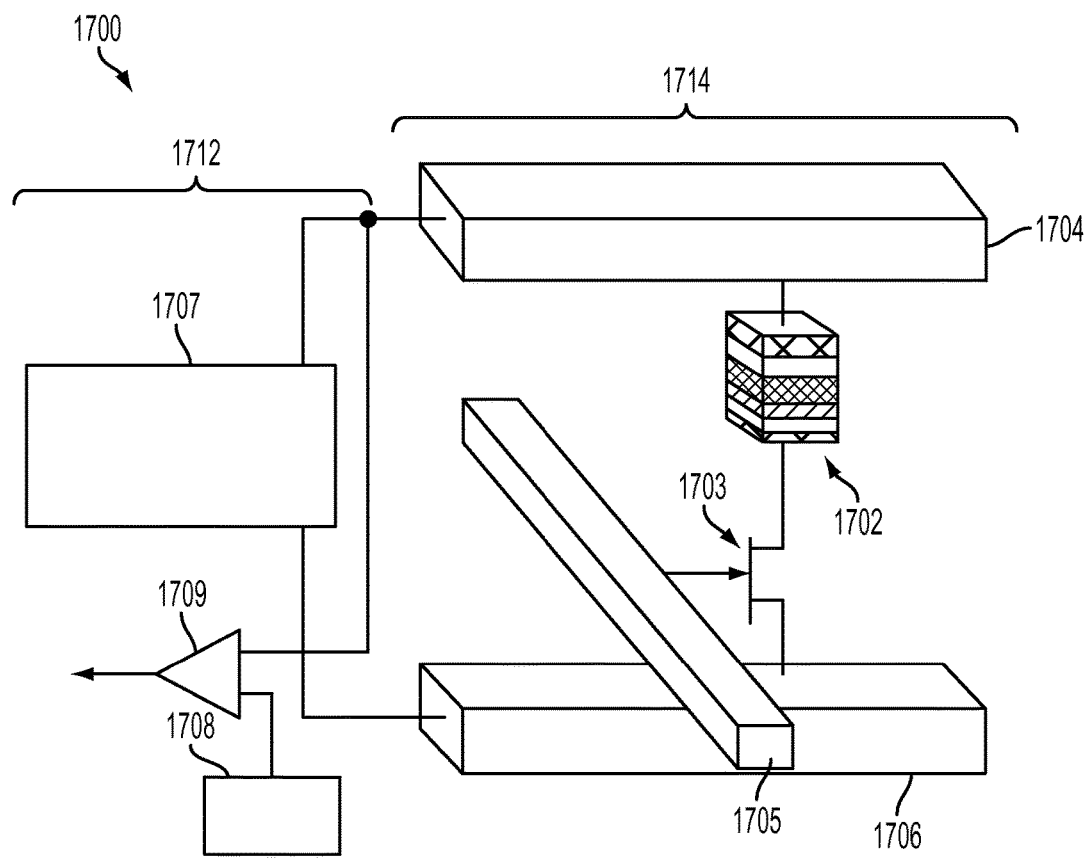
FIG. 17 is a schematic diagram of an STT-MRAM system including a memory cell having a magnetic cell structure according to an embodiment of the present disclosure.

With reference to FIG. 17, illustrated is an STT-MRAM system 1700 that includes peripheral devices 1712 in operable communication with an STT-MRAM cell 1714, a grouping of which may be fabricated to form an array of memory cells in a grid pattern including a number of rows and columns, or in various other arrangements, depending on the system requirements and fabrication technology. The STT-MRAM cell 1714 includes a magnetic cell core 1702, an access transistor 1703, a conductive material that may function as a data/sense line 1704 (e.g., a bit line), a conductive material that may function as an access line 1705 (e.g., a word line), and a conductive material that may function as a source line 1706. The peripheral devices 1712 of the STT-MRAM system 1700 may include read/write circuitry 1707, a bit line reference 1708, and a sense amplifier 1709. The cell core 1702 may be any one of the magnetic cell cores (e.g., the magnetic cell cores 101 (FIG. 1), 201 (FIG. 2), 401 (FIG. 4), 501 (FIG. 5)) described above. Due to the structure of the cell core 1702, the method of fabrication, or both, the STT-MRAM cell 1714 may have a high TMR, and a high MA strength.

In use and operation, when an STT-MRAM cell 1714 is selected to be programmed, a programming current is applied to the STT-MRAM cell 1714, and the current is spin-polarized by the fixed region of the cell core 1702 and exerts a torque on the free region of the cell core 1702, which switches the magnetization of the free region to "write to" or "program" the STT-MRAM cell 1714. In a read operation of the STT-MRAM cell 1714, a current is used to detect the resistance state of the cell core 1702.

To initiate programming of the STT-MRAM cell 1714, the read/write circuitry 1707 may generate a write current (i.e., a programming current) to the data/sense line 1704 and the source line 1706. The polarity of the voltage between the data/sense line 1704 and the source line 1706 determines the switch in magnetic orientation of the free region in the cell core 1702. By changing the magnetic orientation of the free region with the spin polarity, the free region is magnetized according to the spin polarity of the programming current, the programmed logic state is written to the STT-MRAM cell 1714.

To read the STT-MRAM cell 1714, the read/write circuitry 1707 generates a read voltage to the data/sense line 1704 and the source line 1706 through the cell core 1702 and the access transistor 1703. The programmed state of the STT-MRAM cell 1714 relates to the electrical resistance across the cell core 1702, which may be determined by the voltage difference between the data/sense line 1704 and the source line 1706. In some embodiments, the voltage difference may be compared to the bit line reference 1708 and amplified by the sense amplifier 1709.

FIG. 17 illustrates one example of an operable STT-MRAM system 1700. It is contemplated, however, that the magnetic cell cores 101 (FIG. 1), 201 (FIG. 2), 401 (FIG. 4), 501 (FIG. 5) may be incorporated and utilized within any STT-MRAM system configured to incorporate a magnetic cell core having magnetic regions.

Accordingly, disclosed is a semiconductor device comprising a spin torque transfer magnetic random memory (STT-MRAM) array comprising STT-MRAM cells. At least one STT-MRAM cell of the STT-MRAM cells comprises a free region over a substrate and also comprises a fixed region spaced from the free region by an intermediate oxide region. An amorphous attracter region is proximate to at least one of the free region and the fixed region. The amorphous attracter region comprises a species diffused from the at least one of the free region and the fixed region.

Figure 18:
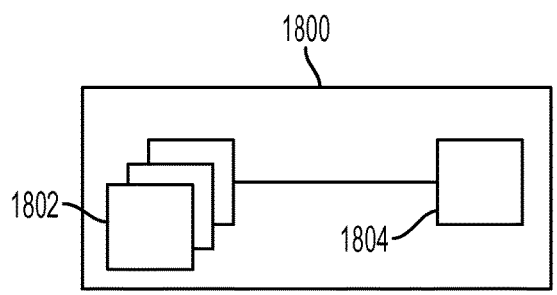
FIG. 18 is a simplified block diagram of a semiconductor device structure including memory cells having a magnetic cell structure according to an embodiment of the present disclosure.

With reference to FIG. 18, illustrated is a simplified block diagram of a semiconductor device 1800 implemented according to one or more embodiments described herein. The semiconductor device 1800 includes a memory array 1802 and a control logic component 1804. The memory array 1802 may include a plurality of the STT-MRAM cells 1714 (FIG. 17) including any of the magnetic cell cores 101 (FIG. 1), 201 (FIG. 2), 401 (FIG. 4), 501 (FIG. 5) discussed above, which magnetic cell cores 101 (FIG. 1), 201 (FIG. 2), 401 (FIG. 4), 501 (FIG. 5) may have been formed according to a method described above and may be operated according to a method described above. The control logic component 1804 may be configured to operatively interact with the memory array 1802 so as to read from or write to any or all memory cells (e.g., STT-MRAM cell 1714 (FIG. 17)) within the memory array 1802.

Accordingly, disclosed is a semiconductor device comprising a spin torque transfer magnetic random access memory (STT-MRAM) array comprising STT-MRAM cells. At least one STT-MRAM cell of the STT-MRAM cells comprises a crystalline magnetic region over a substrate. The crystalline magnetic region is formed from a precursor magnetic material and exhibits magnetism with a perpendicular magnetic orientation. An amorphous attracter material is proximate to the crystalline magnetic region. The amorphous attracter material comprises a diffused species from the precursor magnetic material. An intermediate oxide region is between the crystalline magnetic region and another magnetic region that exhibits magnetism with the perpendicular magnetic orientation.

Figure 19:
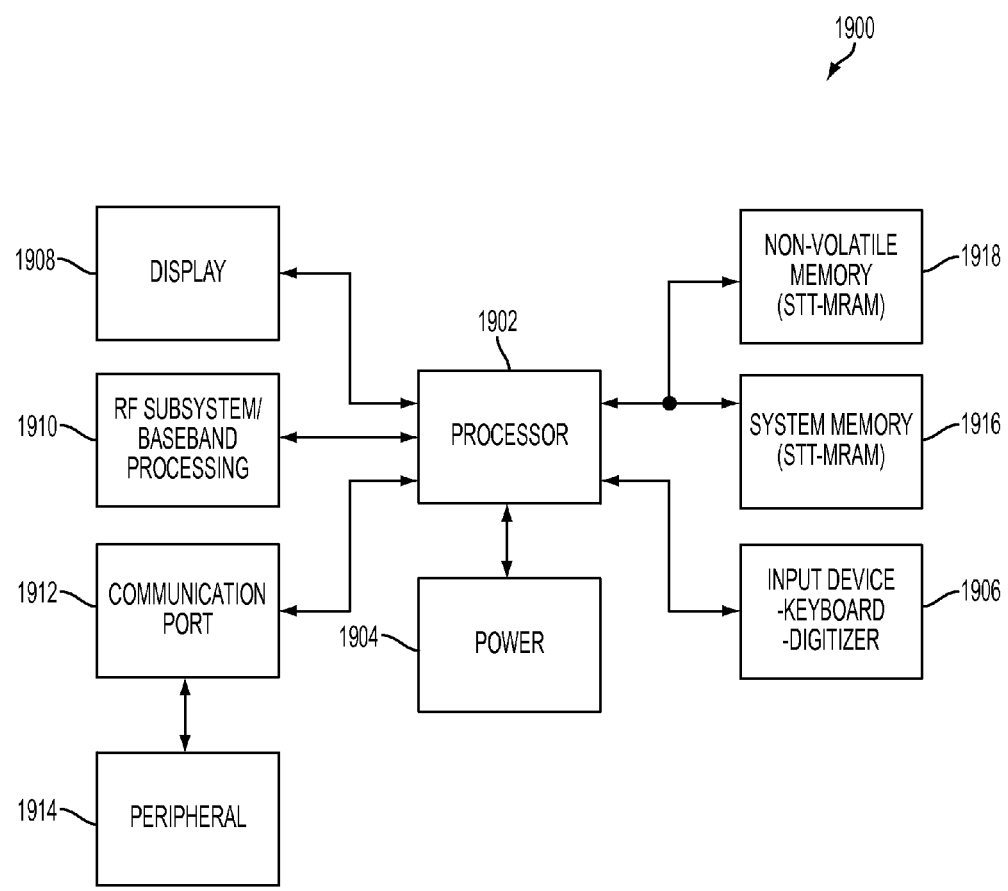
FIG. 19 is a simplified block diagram of a system implemented according to one or more embodiments of the present disclosure.

With reference to FIG. 19, depicted is a processor-based system 1900. The processor-based system 1900 may include various electronic devices manufactured in accordance with embodiments of the present disclosure. The processor-based system 1900 may be any of a variety of types such as a computer, pager, cellular phone, personal organizer, control circuit, or other electronic device. The processor-based system 1900 may include one or more processors 1902, such as a microprocessor, to control the processing of system functions and requests in the processor-based system 1900. The processor 1902 and other subcomponents of the processor-based system 1900 may include magnetic memory devices manufactured in accordance with embodiments of the present disclosure.

The processor-based system 1900 may include a power supply 1904 in operable communication with the processor 1902. For example, if the processor-based system 1900 is a portable system, the power supply 1904 may include one or more of a fuel cell, a power scavenging device, permanent batteries, replaceable batteries, and rechargeable batteries. The power supply 1904 may also include an AC adapter; therefore, the processor-based system 1900 may be plugged into a wall outlet, for example. The power supply 1904 may also include a DC adapter such that the processor-based system 1900 may be plugged into a vehicle cigarette lighter or a vehicle power port, for example.

Various other devices may be coupled to the processor 1902 depending on the functions that the processor-based system 1900 performs. For example, a user interface 1906 may be coupled to the processor 1902. The user interface 1906 may include input devices such as buttons, switches, a keyboard, a light pen, a mouse, a digitizer and stylus, a touch screen, a voice recognition system, a microphone, or a combination thereof. A display 1908 may also be coupled to the processor 1902. The display 1908 may include an LCD display, an SED display, a CRT display, a DLP display, a plasma display, an OLED display, an LED display, a three-dimensional projection, an audio display, or a combination thereof. Furthermore, an RF sub-system/baseband processor 1910 may also be coupled to the processor 1902. The RF sub-system/baseband processor 1910 may include an antenna that is coupled to an RF receiver and to an RF transmitter (not shown). A communication port 1912, or more than one communication port 1912, may also be coupled to the processor 1902. The communication port 1912 may be adapted to be coupled to one or more peripheral devices 1914, such as a modem, a printer, a computer, a scanner, or a camera, or to a network, such as a local area network, remote area network, intranet, or the Internet, for example.

The processor 1902 may control the processor-based system 1900 by implementing software programs stored in the memory. The software programs may include an operating system, database software, drafting software, word processing software, media editing software, or media playing software, for example. The memory is operably coupled to the processor 1902 to store and facilitate execution of various programs. For example, the processor 1902 may be coupled to system memory 1916, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 1916 may include volatile memory, non-volatile memory, or a combination thereof. The system memory 1916 is typically large so that it can store dynamically loaded applications and data. In some embodiments, the system memory 1916 may include semiconductor devices, such as the semiconductor device 1800 of FIG. 18, memory cells including any of the magnetic cell cores 101 (FIG. 1), 201 (FIG. 2), 401 (FIG. 4), 501 (FIG. 5) described above, or a combination thereof.

The processor 1902 may also be coupled to non-volatile memory 1918, which is not to suggest that system memory 1916 is necessarily volatile. The non-volatile memory 1918 may include one or more of STT-MRAM, MRAM, read-only memory (ROM) such as an EPROM, resistive read-only memory (RROM), and flash memory to be used in conjunction with the system memory 1916. The size of the non-volatile memory 1918 is typically selected to be just large enough to store any necessary operating system, application programs, and fixed data. Additionally, the non-volatile memory 1918 may include a high capacity memory such as disk drive memory, such as a hybrid-drive including resistive memory or other types of non-volatile solid-state memory, for example. The non-volatile memory 1918 may include semiconductor devices, such as the semiconductor device 1800 of FIG. 18, memory cells including any of the magnetic cell cores 101 (FIG. 1), 201 (FIG. 2), 401 (FIG. 4), 501 (FIG. 5) described above, or a combination thereof.

Accordingly, disclosed is a semiconductor device comprising an array of magnetic memory cells. At least one magnetic memory cell of the array of magnetic memory cells comprises at least two magnetic regions over a substrate and also comprises an attracter region proximate to at least one of the at least two magnetic regions. The attracter region comprises an attracter material that comprises an alloy of at least one transition element, selected from the group consisting of cobalt, iron, and nickel, and at least one other transition element. The attracter region also comprises a species diffused from the one of the at least two magnetic regions. The at least one magnetic memory cell also comprises an intermediate oxide region between two of the at least two magnetic regions.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A memory cell, comprising:
a magnetic cell core comprising:
a magnetic region comprising a depleted magnetic material, the depleted magnetic material formed from a precursor magnetic material, the precursor magnetic material comprising a diffusible species and at least one other species, the depleted magnetic material comprising the at least one other species;
another magnetic region;
an intermediate oxide region between the magnetic region and the another magnetic region;
an amorphous region proximate to the magnetic region, the amorphous region comprising a first surface facing the magnetic region and a second surface opposite to the first surface, the amorphous region comprising an attracter material having a chemical affinity for the diffusible species that is higher than a chemical affinity of the at least one other species for the diffusible species, the amorphous region comprising both the attracter material and at least a portion of the diffusible species from the precursor magnetic material; and
another oxide region comprising a nonmagnetic oxide material, the nonmagnetic oxide material being in direct physical contact with the second surface of the amorphous region, the magnetic region located between the intermediate oxide region and the another oxide region.

2. The memory cell of claim 1, wherein the precursor magnetic material, from which the depleted magnetic material is formed, comprises a cobalt iron boron (CoFeB) precursor material.

3. The memory cell of claim 1, wherein the diffusible species comprises boron.

4. The memory cell of claim 1, wherein the attracter material comprises an alloy of:
at least one of cobalt, iron, and nickel, and
another transition element.

5. The memory cell of claim 1, wherein the attracter material comprises at least one of an iron-cobalt-tungsten (FeCoW) alloy and an iron-hafnium (FeHf) alloy.

6. The memory cell of claim 1, wherein the amorphous region is between the magnetic region and the another oxide region.

7. The memory cell of claim 1, wherein the magnetic region exhibits a switchable magnetic orientation.

8. The memory cell of claim 1, further comprising another amorphous region of another attracter material, the another amorphous region being proximate to the another magnetic region.

9. The memory cell of claim 8, wherein the another attracter material is internal to the another magnetic region.

10. The memory cell of claim 1, wherein the magnetic region has a bcc (001) crystalline structure.

11. The memory cell of claim 1, wherein the memory cell has a tunnel magnetoresistance of greater than 100%.

12. A method of forming a magnetic memory cell, comprising:
forming a structure comprising:
forming a magnetic material over a substrate;
forming a nonmagnetic oxide material over the magnetic material;
forming another magnetic material over the nonmagnetic oxide material; and forming an amorphous attracter material and another nonmagnetic oxide material proximate to at least one of the magnetic material and the another magnetic material,
the at least one of the magnetic material and the another magnetic material comprising a diffusible species and at least one other species,
the amorphous attracter material having a chemical affinity for the diffusible species that is higher than a chemical affinity of the at least one other species for the diffusible species;
annealing at least a portion of the structure to transfer the diffusible species from the at least one of the magnetic material and the another magnetic material to the amorphous attracter material, to convert the at least one of the magnetic material and the another magnetic material to a depleted magnetic material, and to crystallize the depleted magnetic material without crystallizing the amorphous attracter material, the depleted magnetic material comprising the at least one other species; and
after annealing, patterning the structure to form a magnetic cell core comprising:
a magnetic region comprising the depleted magnetic material, the depleted magnetic material formed from one of the magnetic material and the another magnetic material;
another magnetic region formed from another of the magnetic material and the another magnetic material;
an intermediate oxide region comprising the nonmagnetic oxide material and disposed between the magnetic region and the another magnetic region;
an amorphous region proximate to the magnetic region, the amorphous region comprising a first surface facing the magnetic region and a second surface opposite to the first surface, the amorphous region comprising both the amorphous attracter material and at least a portion of the diffusible species from the at least one of the magnetic material and the another magnetic material; and
another oxide region comprising the another nonmagnetic oxide material, the another nonmagnetic oxide material being in direct physical contact with the second surface of the amorphous region, the magnetic region located between the intermediate oxide region and the another oxide region.

13. The method of claim 12, wherein:
forming the amorphous attracter material precedes forming the magnetic material over the substrate; and
forming a magnetic material comprises forming the magnetic material over the substrate and over the amorphous attracter material.

14. The method of claim 13, wherein forming an amorphous attracter material and another nonmagnetic oxide material comprises:
before forming the amorphous attracter material, forming the another nonmagnetic oxide material over the substrate; and
forming the amorphous attracter material over the another nonmagnetic oxide material.

15. The method of claim 12, wherein the annealing precedes forming the another magnetic material over the nonmagnetic oxide material.

16. The method of claim 12, wherein annealing comprising annealing at a temperature between about 300° C. and about 700° C.

17. The method of claim 12, wherein annealing comprises annealing at a temperature of greater than 500° C.

18. The method of claim 12, wherein forming an amorphous attracter material comprises sputtering a conductive alloy.

19. The method of claim 12:
further comprising forming another amorphous attracter material proximate to the another of the magnetic material and the another magnetic material; and
wherein annealing comprises annealing at least the portion of the structure to transfer another diffusible species from the another of the magnetic material and the another magnetic material to the another amorphous attracter material, to convert the another of the magnetic material and the another magnetic material to another depleted magnetic material, and to crystallize both the depleted magnetic material and the another depleted magnetic material without crystallizing the amorphous attracter material and the another amorphous attracter material.

20. The method of claim 12, wherein forming a nonmagnetic oxide material comprises:
forming a metal over a substrate; and
oxidizing the metal to form the nonmagnetic oxide material.

21. A memory device, comprising:
a spin torque transfer magnetic random access memory (STT-MRAM) array comprising:
STT-MRAM cells, at least one STT-MRAM cell of the STT-MRAM cells comprising:
a magnetic cell core comprising:
a magnetic region over a substrate, the magnetic region comprising a depleted magnetic material, the depleted magnetic material formed from a precursor magnetic material, the precursor magnetic material comprising a diffusible species and at least one other species, the depleted magnetic material comprising the at least one other species, the magnetic region being a free region of the at least one STT-MRAM cell;
another magnetic region, the another magnetic region being a fixed region of the at least one STT-MRAM cell;
an intermediate oxide region between the magnetic region and the another magnetic region;
an amorphous region proximate to the magnetic region, the amorphous region comprising a first surface facing the magnetic region and a second surface opposite to the first surface, the amorphous region comprising an attracter material having a chemical affinity for the diffusible species that is higher than a chemical affinity of the at least one other species for the diffusible species, the amorphous region comprising both the attracter material and at least a portion of the diffusible species from the precursor magnetic material; and
another oxide region comprising a nonmagnetic oxide material, the nonmagnetic oxide material being in direct physical contact with the second surface of the amorphous region, the magnetic region located between the intermediate oxide region and the another oxide region.

22. The memory device of claim 21, wherein the another magnetic region overlays the magnetic region.

23. The memory device of claim 22, wherein the another oxide region comprises a secondary oxide region underlying the magnetic region and the amorphous region.

24. The memory device of claim 21, wherein the magnetic region overlays the another magnetic region.

25. The memory device of claim 24, wherein the another oxide region comprises a secondary oxide region overlying the magnetic region and the amorphous region.

26. The memory device of claim 21, wherein the amorphous region is physically isolated from the another magnetic region.

27. The memory device of claim 21, wherein:
the magnetic region exhibits a crystalline structure and magnetism with a perpendicular magnetic orientation; and
the another magnetic region exhibits magnetism with the perpendicular magnetic orientation.

28. The memory device of claim 27, wherein:
the diffusible species comprises boron; and
the attracter material is chemically bonded to the boron.

29. A memory device, comprising:
an array of magnetic memory cells, at least one magnetic memory cell of the array of magnetic memory cells comprising a magnetic cell core comprising:
at least two magnetic regions over a substrate, the at least two magnetic regions comprising:
a magnetic region comprising a depleted magnetic material, the depleted magnetic material formed from a precursor magnetic material, the precursor magnetic material comprising a diffusible species and at least one other species, the depleted magnetic material comprising the at least one other species; and
another magnetic region;
an amorphous region proximate to the magnetic region, the amorphous region comprising a first surface facing the magnetic region and a second surface opposite to the first surface, the amorphous region comprising:
an attracter material having a chemical affinity for the diffusible species that is higher than a chemical affinity of the at least one other species for the diffusible species, the attracter material comprising an alloy of:
at least one transition element selected from the group consisting of cobalt, iron, and nickel; and
at least one other transition element; and
at least a portion of the diffusible species from the precursor magnetic material; and
an intermediate oxide region between the magnetic region and the another magnetic region; and
another oxide region comprising a nonmagnetic oxide material, the nonmagnetic oxide material being in direct physical contact with the second surface of the amorphous region, the magnetic region located between the intermediate oxide region and the another oxide region.

30. The memory device of claim 29, wherein:
the magnetic region has a crystalline structure; and
the attracter material is amorphous.

31. The memory cell of claim 1, wherein the nonmagnetic oxide material of the another oxide region exhibits a bcc (001) crystalline structure and the amorphous region is disposed directly between the another oxide region and the magnetic region.

32. The memory cell of claim 5, wherein the attracter material consists of the iron-cobalt-tungsten (FeCoW) alloy.

* * * * *

UNITED STATES PATENT AND TRADEMARK OFFICE
CERTIFICATE OF CORRECTION

PATENT NO. : 10,454,024 B2
APPLICATION NO. : 14/193979
DATED : October 22, 2019
INVENTOR(S) : Manzar Siddik and Witold Kula It is certified that error appears in the above-identified patent and that said Letters Patent is hereby corrected as shown below:

In the Specification
Column 7,    Line 45,    change "The tem)." to --The term--
Column 8,    Line 17,    change "the singular terms" to --the singular forms--
Column 8,    Line 50,    change "do not term" to --do not form--
Column 13,   Line 39,    change "portion 114 of" to --portion 417 of--
Column 17,   Line 3,     change "iron-hafnium (Felt)" to --iron-hafnium (FeHf)--
Column 24,   Line 53,    change "1.2 mu)," to --1.2 nm),--

Signed and Sealed this
Twenty-sixth Day of November, 2019

Andrei Iancu
*Director of the United States Patent and Trademark Office*